United States Patent [19]
Zook

[11] Patent Number: 5,920,578
[45] Date of Patent: Jul. 6, 1999

[54] METHOD AND APPARATUS FOR EFFICIENTLY PROCESSING A MULTI-DIMENSIONAL CODE

[75] Inventor: Christopher P. Zook, Longmont, Colo.

[73] Assignee: Cirrus Logic, Inc., Fremont, Calif.

[21] Appl. No.: 08/842,147

[22] Filed: Apr. 23, 1997

[51] Int. Cl.⁶ .................................................. H03M 13/00
[52] U.S. Cl. ...................... 371/37.4; 371/37.5; 371/40.11
[58] Field of Search ................................. 371/37.4, 37.5, 371/40.11

[56] References Cited

U.S. PATENT DOCUMENTS

| | | | |
|---|---|---|---|
| 4,646,301 | 2/1987 | Okamoto et al. | 371/37.4 |
| 4,845,714 | 7/1989 | Zook | 371/37.4 |
| 5,392,299 | 2/1995 | Rhinws et al. | 371/37.5 |
| 5,408,477 | 4/1995 | Okada et al. | 371/37.4 |
| 5,412,667 | 5/1995 | Havemose | 371/37.5 |
| 5,563,897 | 10/1996 | Pyndiah et al. | 371/37.4 |
| 5,592,498 | 1/1997 | Zook | 371/40.11 |
| 5,701,304 | 12/1997 | Glover et al. | 371/10.2 |
| 5,719,884 | 2/1998 | Roth et al. | 371/37.4 |

*Primary Examiner*—Reba I. Elmore
*Assistant Examiner*—Shelly A Chase
*Attorney, Agent, or Firm*—Howard H. Sheerin; Dan A. Shifrin

[57] ABSTRACT

An error detection and correction system is disclosed for efficiently processing a product code typically employed in an optical storage device. In particular, the present invention decreases the processing time associated with iteratively processing the rows and columns of the product code by processing only those code words that were "flagged" during a previous iteration. If, for example, while processing the column code words a byte in a column code word is corrected, then the corresponding intersecting row code word is flagged for processing during the "row pass." Only the row code words that have been flagged are processed during the "row pass", which significantly reduces buffer access latency and increases the overall throughput of the storage system. To assist in error detection and correction, an array of erasure pointers is employed where each erasure pointer corresponds to a byte in a code word. If there are no initial pointers set for a code word and the code word is uncorrectable or the possibility of a miscorrection is high, then all of the pointers for that code word are set and all of the intersecting code words are flagged for processing during the next pass. If a code word is error-free or correctable, then its pointers are cleared and the intersecting code words corresponding to the cleared erasure pointers are flagged for processing during the next pass. Eventually, enough pointers in a previously uncorrectable code word may be cleared such that the code word becomes correctable.

24 Claims, 18 Drawing Sheets

METHOD AND APPARATUS FOR EFFICIENTLY PROCESSING A MULTI-DIMENSIONAL CODE

FIELD OF INVENTION

The present invention relates to error detection and correction systems (EDAC) for optical storage devices, particularly to an improved method and apparatus for processing a multi-dimensional code, such as a product code.

BACKGROUND OF THE INVENTION

Optical storage devices, such as CD-ROM, DVD, and the like, are used to store large amounts of audio, visual and/or computer data in a non-volatile manner. Sectors of data are typically recorded in spiral tracks on a rotating optical disk and, upon read back, the data are subject to errors due to noise and dynamics of the recording process. Accurate reproduction of corrupted data requires an error detection and correction (EDAC) system which implements an error correction code (ECC), such as a Reed-Solomon code. The EDAC system employed in optical storage devices is typically multi-layered meaning that user data are passed through a series of encoders which implement a series of ECC layers. Upon readback, the data is decoded according to the layered ECC in reverse order until error-free user data is ultimately extracted.

A typical data path employed in a CD-ROM type storage device is shown in FIG. 1. During a write operation, user data from a host is encoded 2 into a product code of P and Q code words having $P_{ECC}$ and $Q_{ECC}$ redundancy symbols, respectively. Data output by the P/Q encoder 2 is then scrambled 4 and the scrambled data passed through a C2 encoder 6 which processes the data in 24 byte blocks and attaches 4 bytes of C2 redundancy. The output of the C2 encoder 6 is then interleaved 8 into blocks of 28 bytes and the interleaved data passed through a C1 encoder 10 which attaches 4 bytes of C1 redundancy. The data is then written to the disk 12 in 32 byte blocks and, during read back, the process is run in reverse. The C1 and C2 redundancy are referred to as a Cross Interleave Reed-Solomon Code (CIRC).

During a read operation, the C1 decoder 10 decodes the 32 byte blocks read from the disk and corrects up to two bytes in error using the 4 bytes of C1 redundancy. If more than two errors are detected, then the C1 decoder 10 generates a C1 erasure pointer for each of the 32 bytes in the block. The C2 decoder 6 uses the C1 erasure pointers to assist in correcting the data output by the de-interleaver 8 (the C2 decoder can correct up to 4 bytes in error using up to four C1 erasure pointers and the 4 bytes of C2 redundancy). If the C2 decoder 6 successfully corrects a data block, then the C1 erasure pointers may be passed on as C2 erasure pointers. If a data block is uncorrectable, the C2 decoder sets a C2 erasure pointer for each of the 28 bytes in the block. The P/Q decoder 2 uses the C2 erasure pointers to assist in correcting the data output by the de-scrambler 4.

FIG. 2A shows a typical sector format employed in a CD-ROM storage device which comprises 2,352 bytes of information. The first 12 bytes store a sync mark 14 for use in byte synchronizing to the remaining data in the sector. The next 4 bytes store header information 16, such as the sector address and operating mode. The next 2048 bytes store the user data 18, which are followed by 4 bytes of CRC redundancy 20 and 8 pad bytes 22. The last 276 bytes store the $P_{ECC}$ and $Q_{ECC}$ redundancy 24A and 24B for the P and Q code words of the product code as shown in FIG. 2B. The $P_{ECC}$ and $Q_{ECC}$ redundancy 24A and 24B are generated by the P/Q encoder 2 of FIG. 1 during a write operation, and upon read back, used by the P/Q decoder 2 to detect and correct errors in the header 16, the user data 18, and the CRC bytes 20.

Operation of the P/Q encoder/decoder 2 is well known and is understood with reference to FIG. 2B. The data are arranged into two sets of intersecting code words: a set of P column code words, including appended $P_{ECC}$ redundancy; and a set of Q row code words, including appended $Q_{ECC}$ redundancy which are generated by processing the data diagonally as shown. During a read operation, the error correction process operates iteratively. A pass is made over the P code words, and then a pass is made over the Q code words, and then another pass is made over the P code words, and so on. If the number of errors in a P code word exceeds the error correction capability of the code, then the pass over the Q code words may correct enough errors such that the P code word becomes correctable in the next pass. Similarly, an uncorrectable Q code word may become correctable if enough errors are corrected during the pass over the P code words. Thus, the P/Q decoder 2 processes the P and Q code words in iterative passes until all of the code words are corrected, or until the number of iterations exceeds some predetermined maximum value (indicating that the sector is uncorrectable).

In addition to interleaving 8 the C2 encoded data as shown in FIG. 1, the P and Q product code of FIG. 2A may also be interleaved to form an EVEN and ODD product code as shown in FIG. 2C. In this format, the EVEN product code stores the even numbered bytes of a sector and the ODD product code stores the odd numbered bytes of a sector. Those skilled in the art understand that interleaving enhances the ability to correct a long burst error by spreading the error across multiple code words. In addition, interleaving the data into EVEN and ODD product codes enables the P/Q decoder 2 to correct two code words (two P or two Q) simultaneously, which significantly increases the throughput.

Increasing the throughput of the storage device is a significant design consideration. The speed of the P/Q decoder 2 is directly related to the number of buffer accesses required to read the P and Q code words, and the processing time required to correct a code word. In many prior art EDAC systems for processing a product code, all of the P and Q code words are read and processed during each iteration without regard to whether a code word may have been determined to be error-free or fully corrected in a prior iteration. U.S. Pat. No. 5,412,667 entitled "DECODER FOR CROSS INTERLEAVED ERROR CORRECTING ENCODED DATA" improves the speed of a product code processor in an optical storage device by "marking" code words as error-free. In this manner, the error-free code words are skipped during subsequent passes, which significantly increases the over all speed of the EDAC system. When errors are corrected in a particular code word (P or Q), only those code words which intersect at the corrected bytes are marked as containing errors so that their syndromes are recalculated during the next pass. Although this method is an improvement over processing all of the P and Q code words in every pass, it fails to take into account erasure pointers, such as those generated by the C2 decoder 6 or those generated internally. In other words, the '667 patent marks only those code words that intersect at corrected data bytes for processing during the next pass, without considering the significance of erasure pointers.

There is, therefore, a need for a more efficient EDAC system that takes into account erasure pointers (e.g., C2 erasure pointers) in determining whether to read and process a P or Q code word in a product code of an optical storage device.

Another aspect of the present invention concerns the CRC redundancy 20 shown in FIG. 2A, which is used to check the validity of the corrections made by the P/Q decoder 2 of FIG. 1. The CRC redundancy 20 is typically generated by processing the header and user data according to:

$$CRC\ \text{redundancy} = P(x) \cdot x^{n-k} \bmod G(x),$$

where P(x) is the header and user data represented as a polynomial having coefficients in a finite field GF(2), n–k is the number of CRC redundancy symbols, and G(x) is a generator polynomial. The CRC redundancy 20 is then appended to the user data as shown in FIG. 2A before the resulting code word is written to the disk. During a read operation, the data read from the disk are processed to generate a CRC syndrome $S_{CRC}$ according to:

$$S_{CRC} = C(x) \bmod G(x),$$

where C(x) is the data polynomial or code word (including the CRC redundancy) read from the disk. If the data C(x) is error-free, then the syndrome $S_{CRC}$ will be zero. By generating the CRC syndrome after the P/Q encoder 2 has finished correcting the product code, the CRC operates to validate the P/Q corrections and detect miss-corrections. This is an extremely important function because it prevents the EDAC system from passing "bad data" to the host system.

Generating the CRC syndrome $S_{CRC}$ after the P/Q decoder 2 finishes correcting the product code requires that all of the data be read from the buffer. This overhead can significantly reduce the overall throughput of the EDAC system but, as disclosed in U.S. Pat. No. 5,592,498 entitled "CRC/EDC CHECKER SYSTEM," it can be avoided. In the '498 patent, the CRC syndrome $S_{CRC}$ is generated concurrent with the processing of the P and Q code words. In the first pass of the P code words, a tentative CRC syndrome $S_{CRC}$ is generated, and then when the P/Q decoder makes a correction, the CRC syndrome $S_{CRC}$ is simultaneously updated to reflect the correction. In this manner, when the P/Q decoder 2 is finished processing each pass of the product code, the CRC syndrome $S_{CRC}$ is available immediately to check whether the corrections are valid and complete. However, the CRC generator disclosed in the '498 patent will not operate correctly with a P/Q decoder 2 that skips certain P or Q code words; rather, it only operates with a P/Q decoder 2 that reads all of the P and Q code words in every pass.

Another disadvantage with prior art P/Q decoders is the delay associated with determining whether the product code has been fully corrected. Because the prior art P/Q decoders do not generate the CRC syndrome $S_{CRC}$ concurrent with correcting the product code, they must make an additional pass to determine if in fact the corrections are complete. If, for example, no uncorrectable errors are encountered after completing a pass over the P code words, the prior art P/Q decoders perform another pass over the Q code words to verify that the corrections are in fact complete (i.e., to verify that the Q syndromes are all zero). Thus, prior art P/Q decoders will not generate the CRC syndrome $S_{CRC}$ for checking the validity of the corrections until all zero syndromes are generated for a P or Q pass—which is inefficient.

There is, therefore, a need for a CRC syndrome generator that can compute the CRC syndrome $S_{CRC}$ concurrent with the P/Q decoder 2 processing the product code, even if the P/Q decoder 2 skips a code word. Another object of the present invention is to avoid the additional pass required in the prior art EDAC systems to verify that the corrections are complete, as well as to avoid the additional pass required to generate the CRC syndrome $S_{CRC}$.

SUMMARY OF THE INVENTION

An error detection and correction system is disclosed for efficiently processing a product code typically employed in an optical storage device. In particular, the present invention decreases the processing time associated with iteratively processing the rows and columns of the product code by processing only those code words that were "flagged" during a previous iteration. If, for example, while processing the column code words a byte in a column code word is corrected, then the corresponding intersecting row code word is flagged for processing during the "row pass." Only the row code words that have been flagged are processed during the "row pass", which significantly reduces buffer access latency and increases the overall throughput of the storage system. To assist in error detection and correction, an array of erasure pointers is employed where each erasure pointer corresponds to a symbol in a code word. If there are no initial pointers available for a code word and the code word is uncorrectable or the possibility of a miss-correction is high, then all of the pointers for that code word are set and all of the intersecting code words are flagged for processing during the next pass. If a code word is error-free or correctable, then its pointers are cleared and the intersecting code words corresponding to the cleared erasure pointers are flagged for processing during the next pass. Eventually, enough pointers in a previously uncorrectable code word may be cleared such that the code word becomes correctable.

BRIEF DESCRIPTION OF THE DRAWINGS

The above and other aspects and advantages of the present invention will be better understood by reading the following detailed description of the invention in conjunction with the drawings, wherein.

DETAILED DESCRIPTION OF THE PREFERRED EMBODIMENT

Figure 2A:
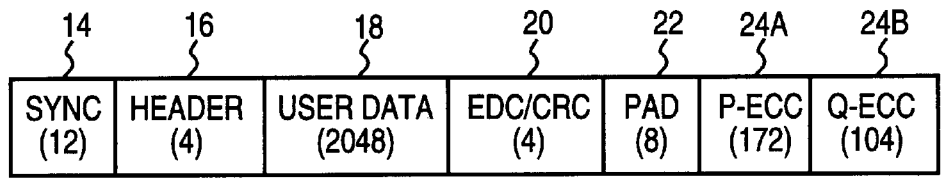
FIG. 2A shows a typical format of a sector employed in a CD-ROM optical storage device.
Figure 2B:
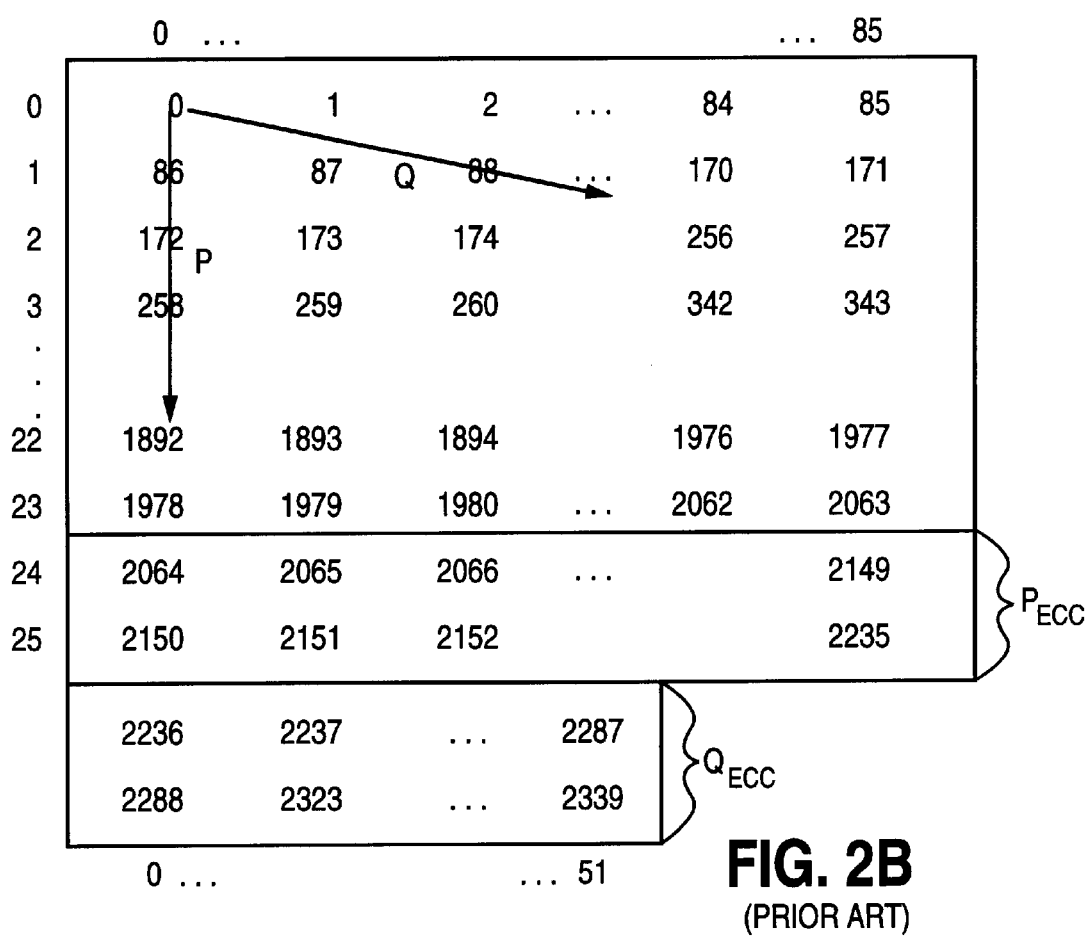
FIG. 2B illustrates the format of a P/Q product code for encoding the header and user data of FIG. 2A.
Figure 2C:
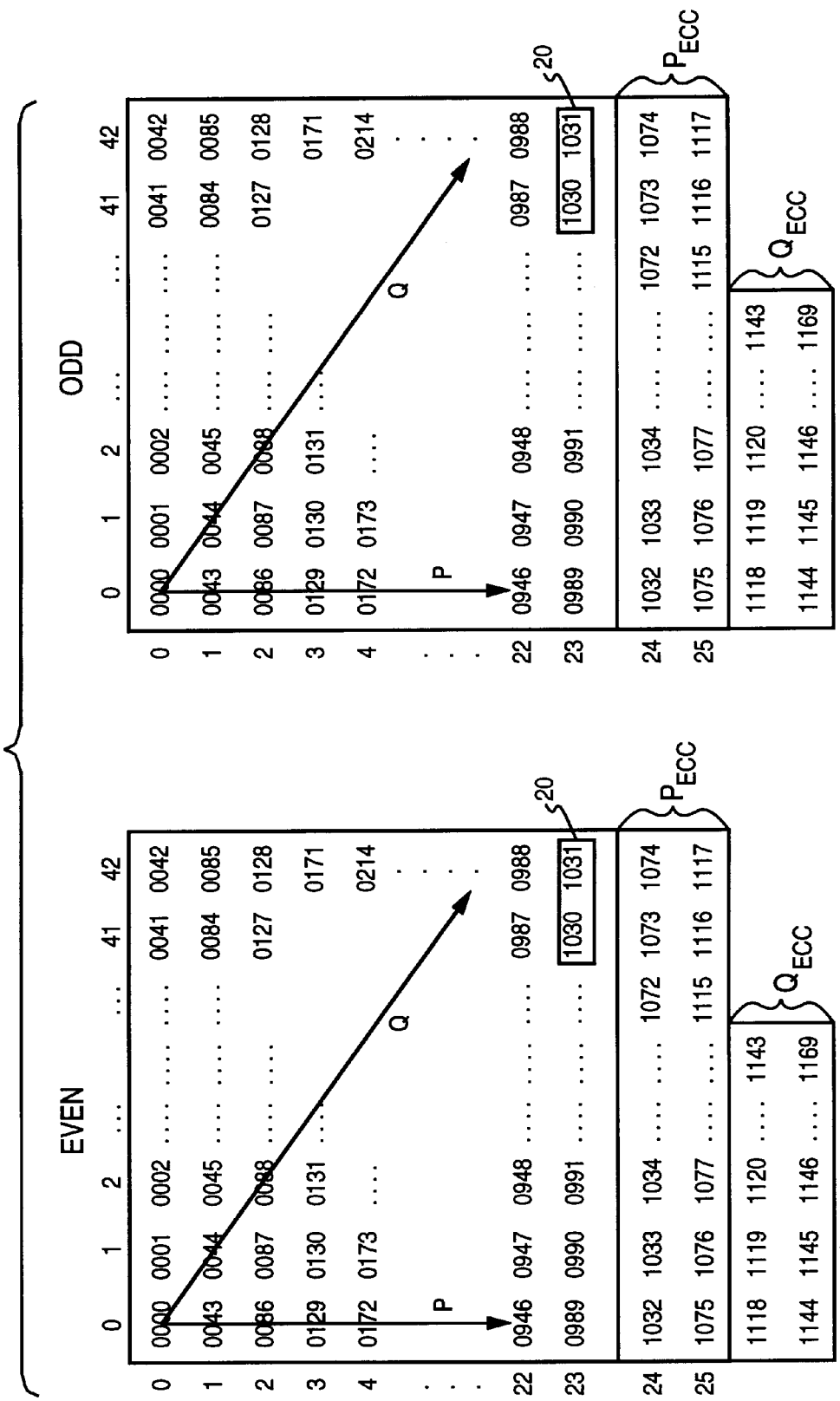
FIG. 2C shows the P/Q product code of FIG. 2B implemented as an EVEN and ODD P/Q product codes which store the even and odd bytes, respectively.
Figure 3:
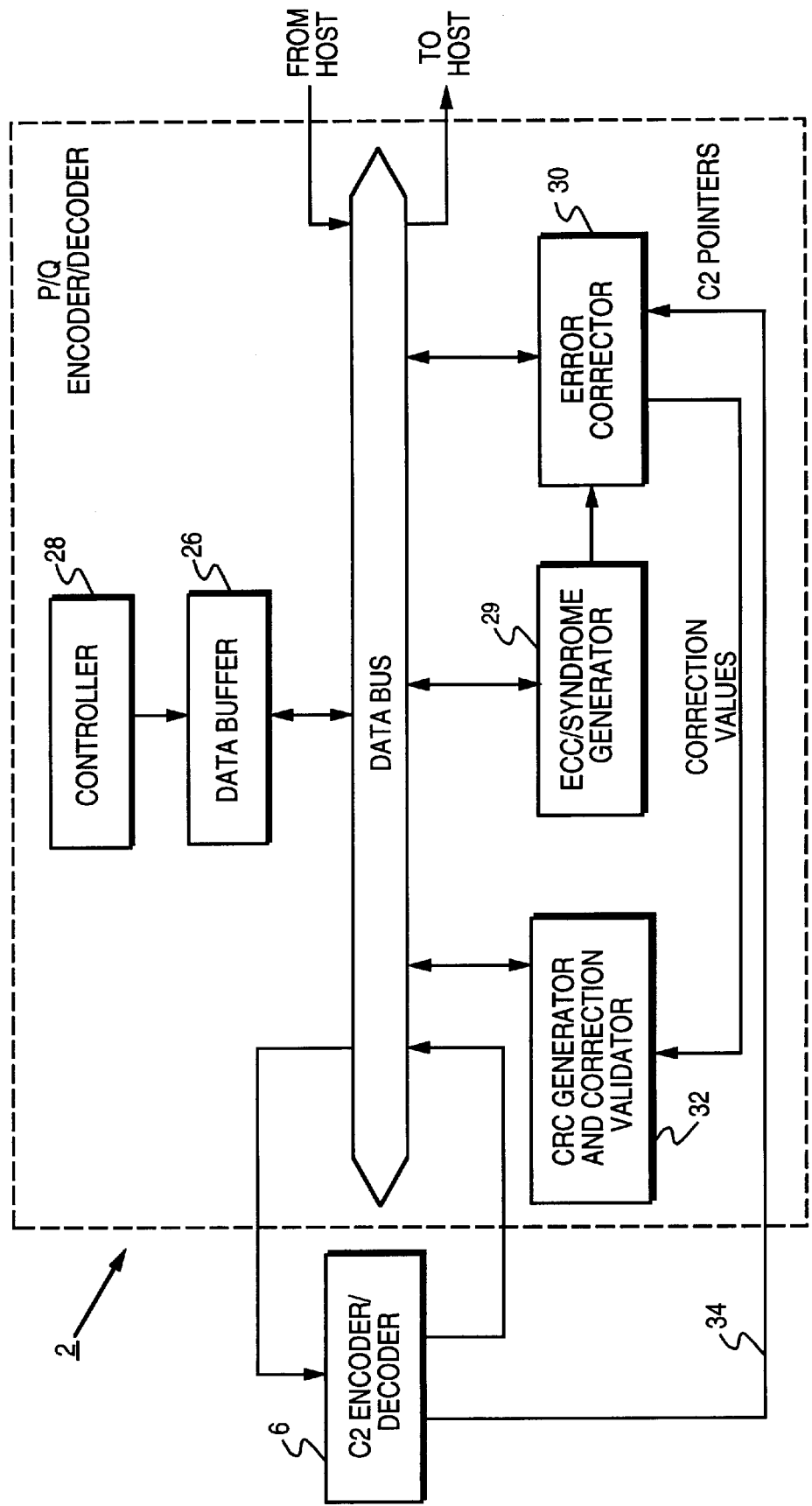
FIG. 3 is a block diagram of the EDAC system of the present invention, including an ECC/syndrome generator, an error corrector, and a CRC generator and correction validator.

FIG. 3 shows a block diagram of the P/Q encoder/decoder 2 of the present invention, including a data buffer 26 for storing read/write data, a controller 28 for arbitrating access to the data buffer 26, a primary ECC/syndrome generator 29 and error corrector 30 (e.g., multiple burst Reed-Solomon), and a secondary ECC generator and correction validator 32 (e.g., CRC). During a write operation, the following steps are executed asynchronously: (1) user data from a host is stored in the data buffer 26; (2) the ECC generator 29 reads the user data from the buffer 26 and generates the $P_{ECC}$ and $Q_{ECC}$ for the interleaved P/Q product codes of FIG. 2C; and (3) the CRC generator 32 generates the CRC symbols 20 for the interleaved P/Q product codes of FIG. 2C as the data is read from the buffer 26 and transferred to the C2 encoder 6. During a read operation, the following steps are executed concurrently and asynchronously: (1) data from the C2 decoder is stored in the data buffer 26; (2) if a code word is flagged for processing, then the syndrome generator 29 reads data from the data buffer 26 and generates error syndromes; (3) if the syndromes are non-zero, the ECC error corrector 30 uses the syndromes and the C2 erasure pointers 34 to correct the data wherein the correction values are applied to the CRC correction validator 32 for adjusting the CRC syndrome $S_{CRC}$ accordingly; and (4) when no uncorrectable errors are encountered during a P or Q pass, the CRC syndrome $S_{CRC}$ is used to check whether the corrections are valid and complete.

The technique of the present invention for expediting the P/Q decoder 2 by skipping code words based on the erasure pointers and corrections to the code words, as well as the technique for concurrently generating the CRC syndrome $S_{CRC}$, are described in the following sections with reference to the flow diagrams of FIGS. 4A–4K.

Erasure Pointer Processing

Figure 1:
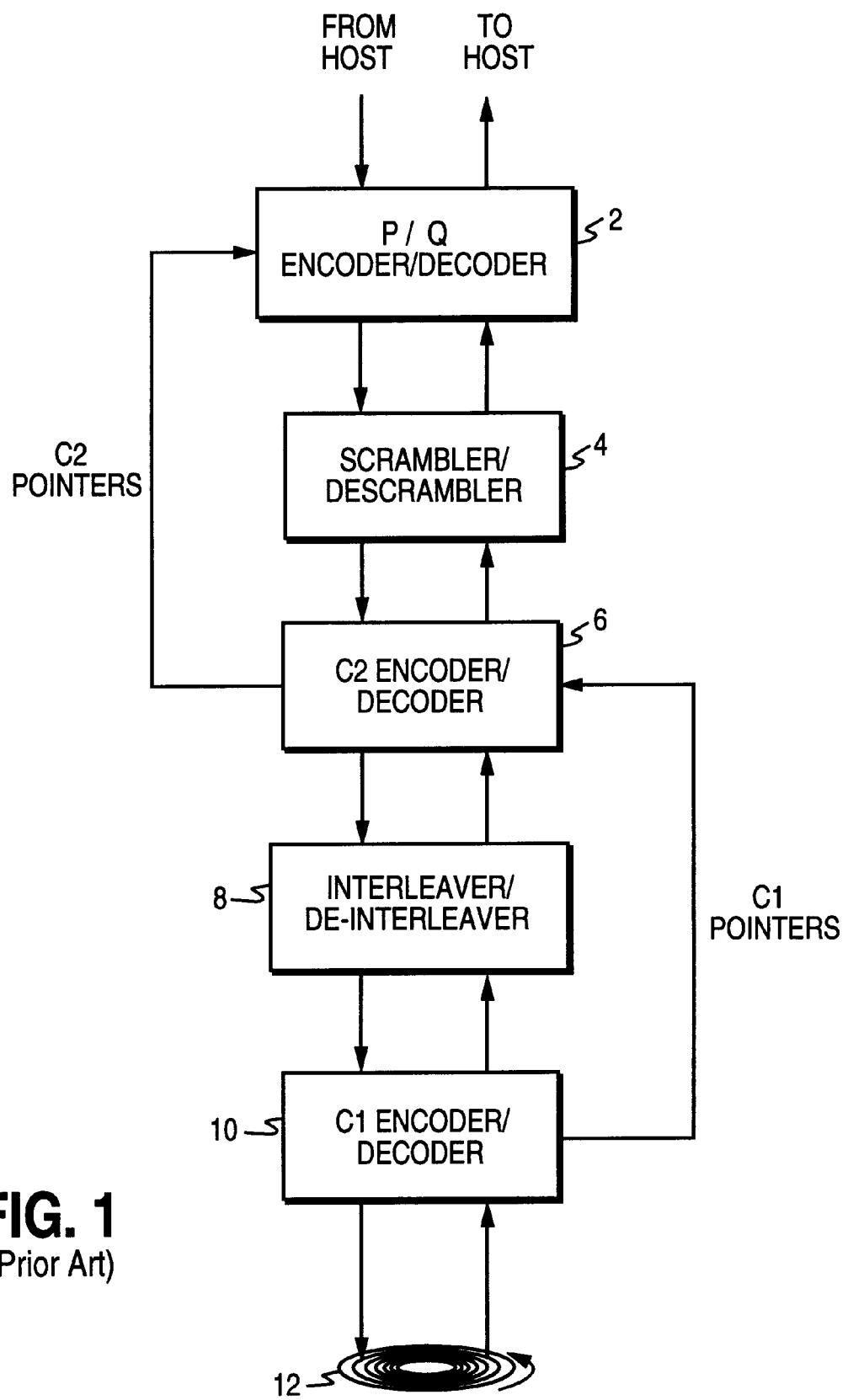
FIG. 1 is a block diagram of a typical error detection and correction (EDAC) system employed in a CD-ROM optical storage device.

Each P and Q code word in the product codes shown in FIG. 2C has an associated array of erasure pointers (or pointers) which indicate potential symbols in error, and a read flag which indicates whether the code word is error-free (i.e., can be skipped). As described above, the code word pointers may be initialized by the C2 decoder 6 of FIG. 1, and they assist the P/Q decoder 2 in correcting errors in the product code. During processing of the product code, the P/Q decoder 2 may set or clear the pointers based on the expediting algorithm of the present invention, the flow diagrams for which are set forth in FIGS. 4A–4K.

Figure 4A:
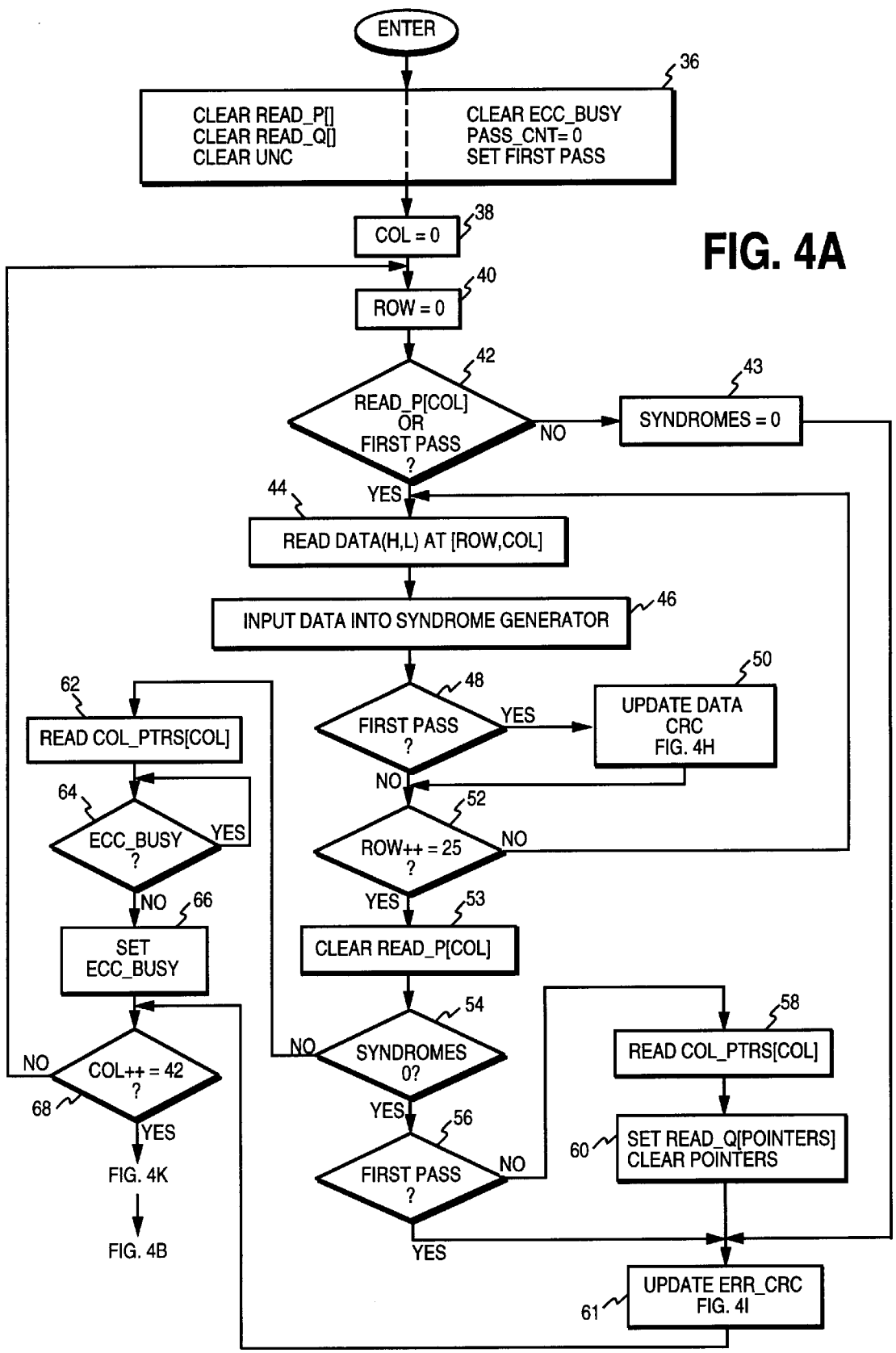
FIG. 4A is the main flow diagram for processing the P (or column) code words of the product code.

Once a complete product code has been transferred from the C2 decoder 6 into the data buffer 26 of FIG. 3, then starting with FIG. 4A, an initialization step 36 clears the read flags READ_P[ ] and READ_Q[ ], clears a UNC flag which indicates whether an uncorrectable error has been encountered, clears an ECC_BUSY flag which indicates whether the error corrector 30 is busy correcting a code word, sets a pass count variable PASS_CNT to zero, and sets a FIRST PASS flag which signifies the first pass through the P and Q code words. During the first pass, all of the P and Q code words are read and processed regardless as to the state of the read flags.

After executing the initialization step 36, a COL variable, which keeps track of the current column P code word being processed, is set to zero at step 38 (i.e., set to the first P code word). And at step 40, a ROW variable, which keeps track of the current row symbol of the current P code word, is set to zero (i.e., set to the first symbol in the current P code word). Next, if at step 42 the read flag for the current P code word READ_P[COL] is set, or if it is the first P pass, then a loop is executed to read the current P code word and generate the error syndromes. The current symbol from the current EVEN and ODD P code word of FIG. 2C (designated H,L) are read from the data buffer 26 of FIG. 3 at step 44 and input into the syndrome generator 29 at step 46. If this is the first pass over the P code words (i.e., FIRST PASS is true at step 48), then the symbols read at step 44 are also used to update the data CRC syndrome at step 50 by executing the flow diagram of FIG. 4H, which is described in greater detail below. At the end of the loop, if ROW is not at the last symbol of the current P code word at step 52 (i.e., not 25), then ROW is incremented and the loop is re-executed to read the next symbol for use in calculating the error syndromes and updating the data CRC syndrome.

Once all of the symbols have been read for the current P code word (i.e., ROW is 25 at step 52), the syndrome generator 29 of FIG. 3 will have generated the ECC syndromes for the code word. The read flag READ_P[COL] is cleared at step 53 so that the current P code word is skipped during the next P pass (unless its read flag is set again as described below). If the syndromes are zero at step 54, indicating that the code word is error-free, and it is not the first pass (i.e., FIRST PASS is false at step 56), then the current P code word pointers are read at step 58. At step 60, the read flags READ_Q[POINTERS] are set for the Q code words that intersect the current P code word at the pointer locations, and the pointers for the current P code word are then cleared. During the first pass (i.e., when FIRST PASS is true at step 56), the erasure pointers are not changed and the latency in accessing the buffer at step 58 to read the pointers is avoided. In either case, the error CRC syndrome is updated at step 61 to position it over the next P code word by executing the flow diagram of FIG. 4I described below.

If the syndromes are not zero at step 54, indicating that the P code word contains errors, then the pointers for the current P code word are read at step 62. Next the system checks the ECC_BUSY flag at step 64. If set—indicating that the error corrector 30 is busy correcting a previous code word—then the system waits until the ECC_BUSY flag is cleared. Once cleared, the ECC_BUSY flag is set at step 66 to start the error correction procedure for the current P code word. The error correction procedure is set forth in the flow diagram of FIG. 4C, and it is executed concurrent with generating the syndromes for the next P code word. In other words, after setting the ECC_BUSY flag at step 66, the syndrome generation procedure of FIG. 4A immediately begins processing the next P code word while the previous P code word is corrected by the error corrector 30.

If at step 42 the read flag READ_P[COL] is not set and it is not the first pass, then the current P code word is skipped and the latency associated with reading the code word from the buffer and generating error syndromes is avoided. However, the error CRC syndrome is still updated at step 61 in order to position it over the next P code word. Skipping code words flagged as error-free significantly increases the throughput of the P/Q decoder 2 which is an important aspect of the present invention.

Figure 4B:
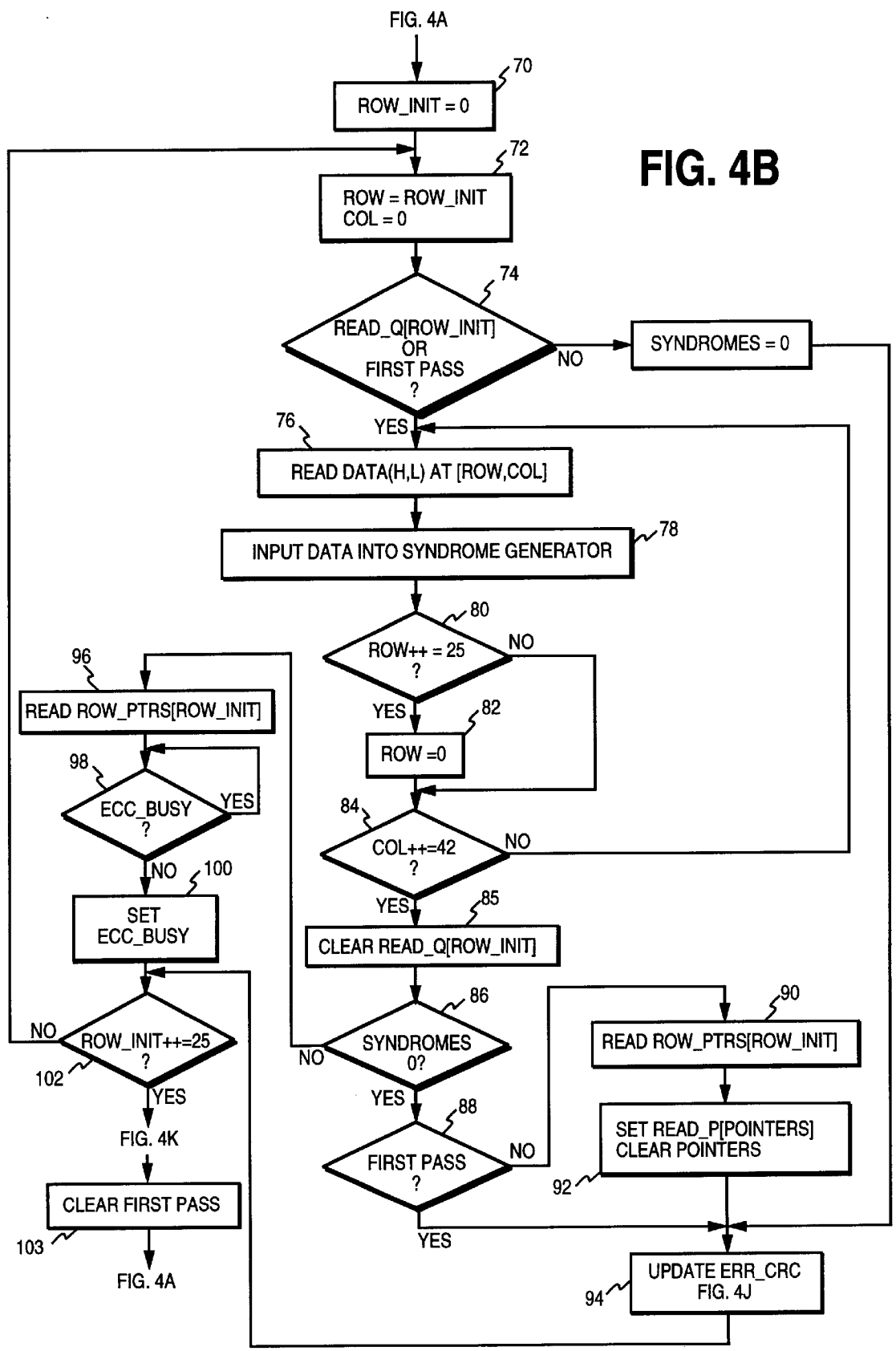
FIG. 4B is the main flow diagram for processing the Q (or row) code words of the product code.
Figure 4C:
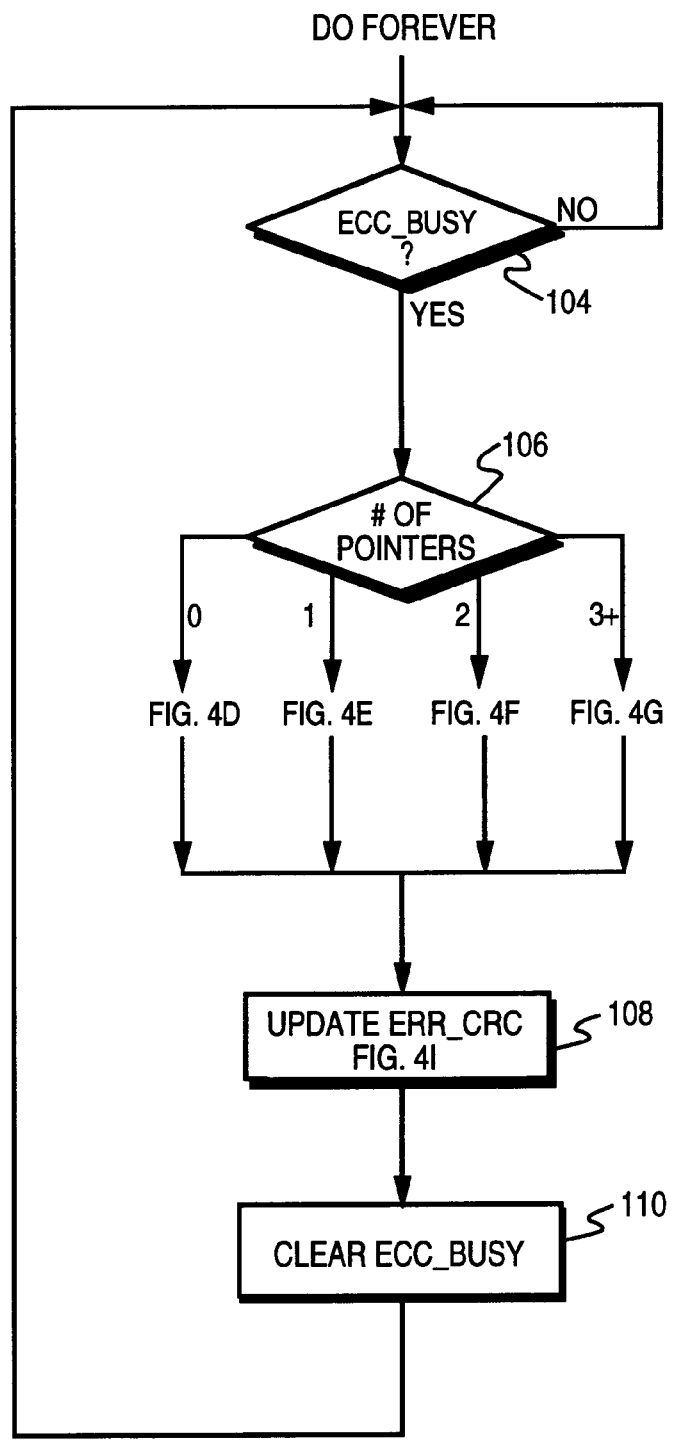
FIG. 4C shows a flow diagram for processing erasure pointers to facilitate skipping "error-free" code words, as well as for updating the error CRC syndrome when a code word is corrected.
Figure 4D:
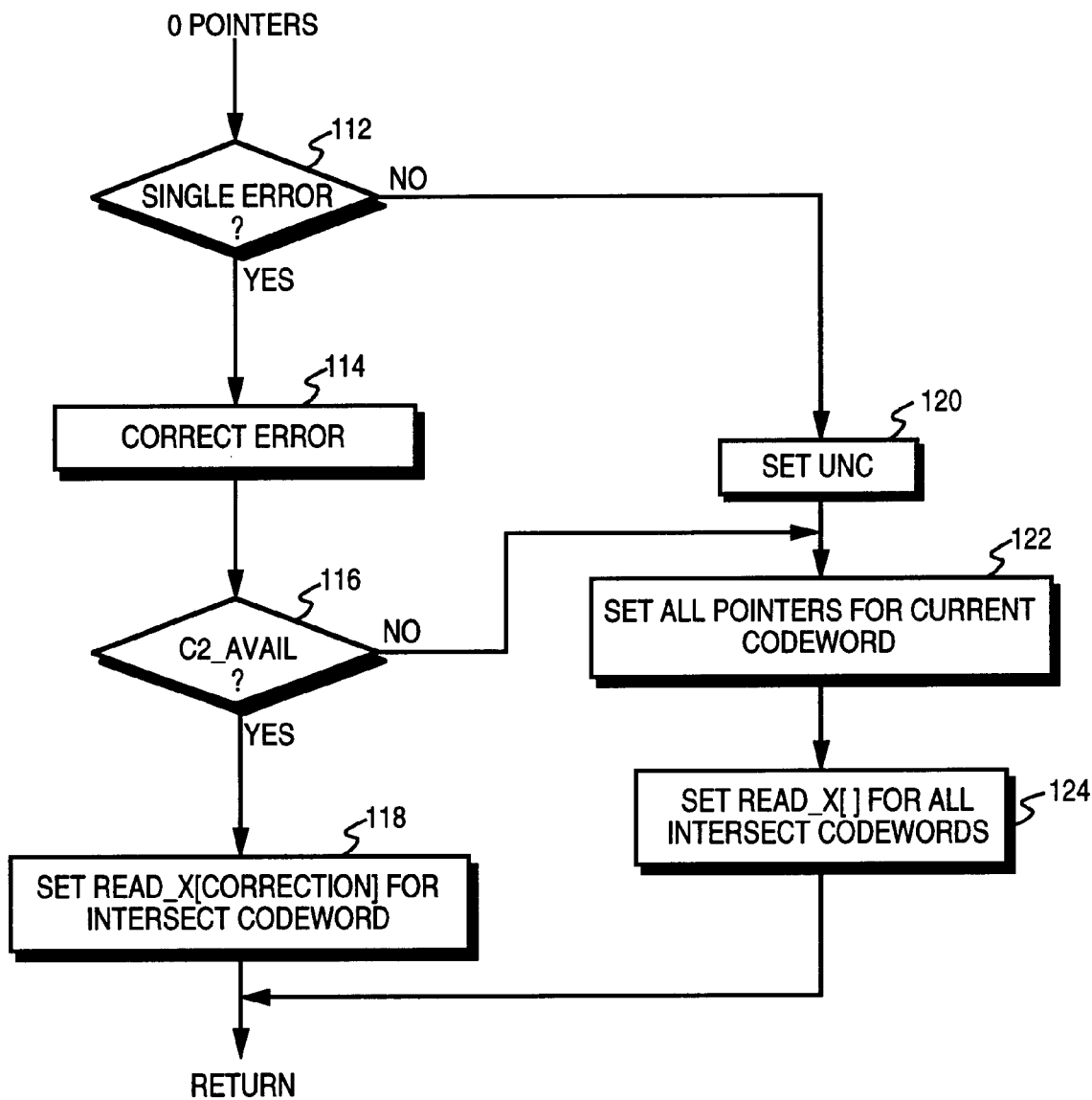
FIG. 4D is the flow diagram for the case where a code word contains errors (non-zero syndromes) and zero erasure pointers.
Figure 4E:
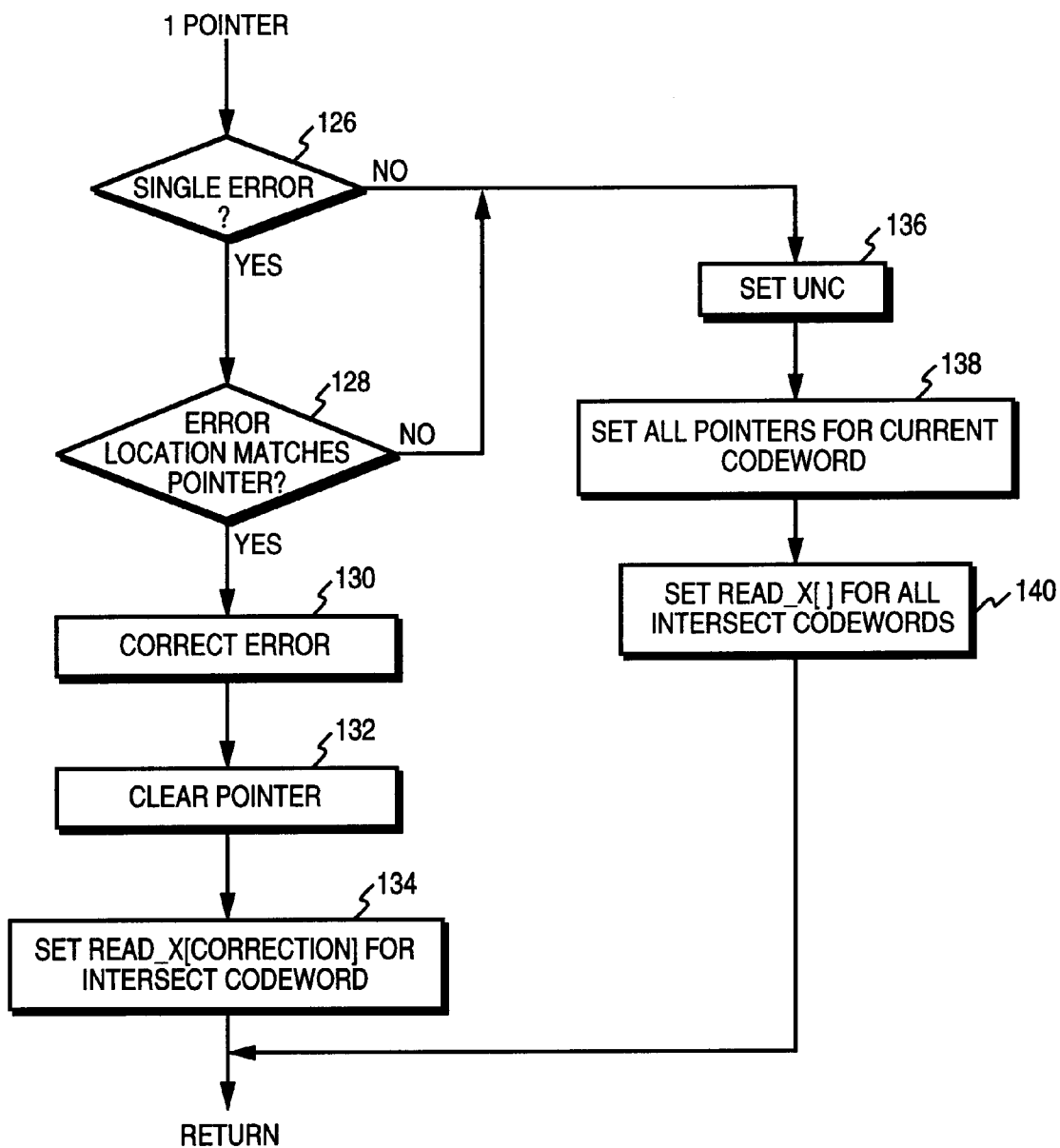
FIG. 4E is the flow diagram for the case where a code word contains errors (non-zero syndromes) and one erasure pointer.
Figure 4F:
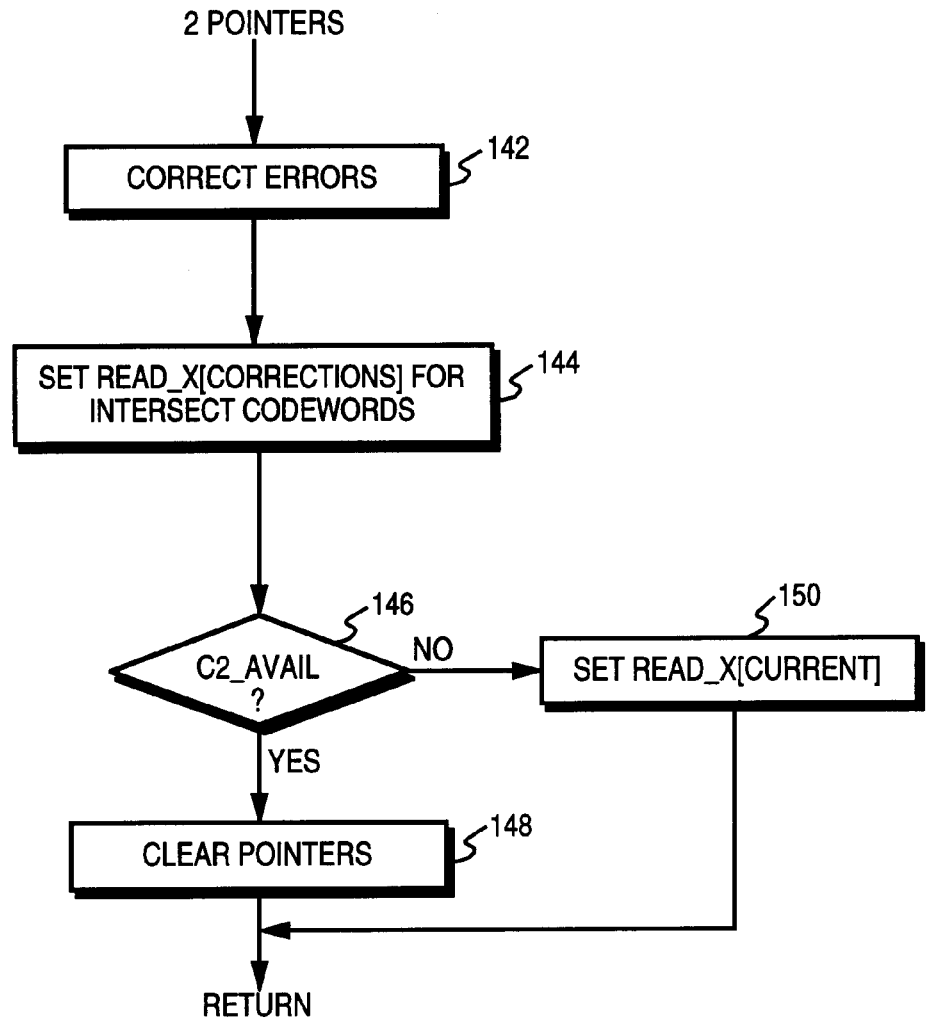
FIG. 4F is the flow diagram for the case where a code word contains errors (non-zero syndromes) and two erasure pointers.
Figure 4G:
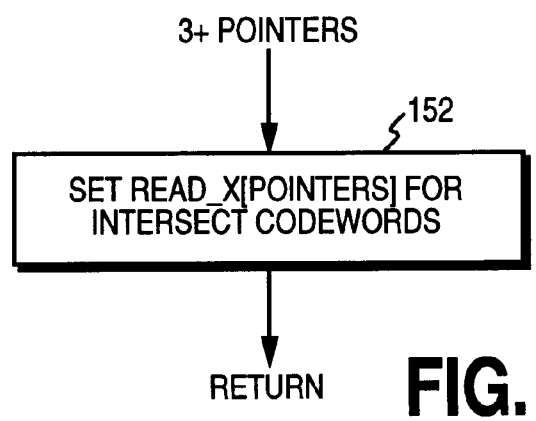
FIG. 4G is the flow diagram for the case where a code word contains errors (non-zero syndromes) and three-plus erasure pointers.
Figure 4H:
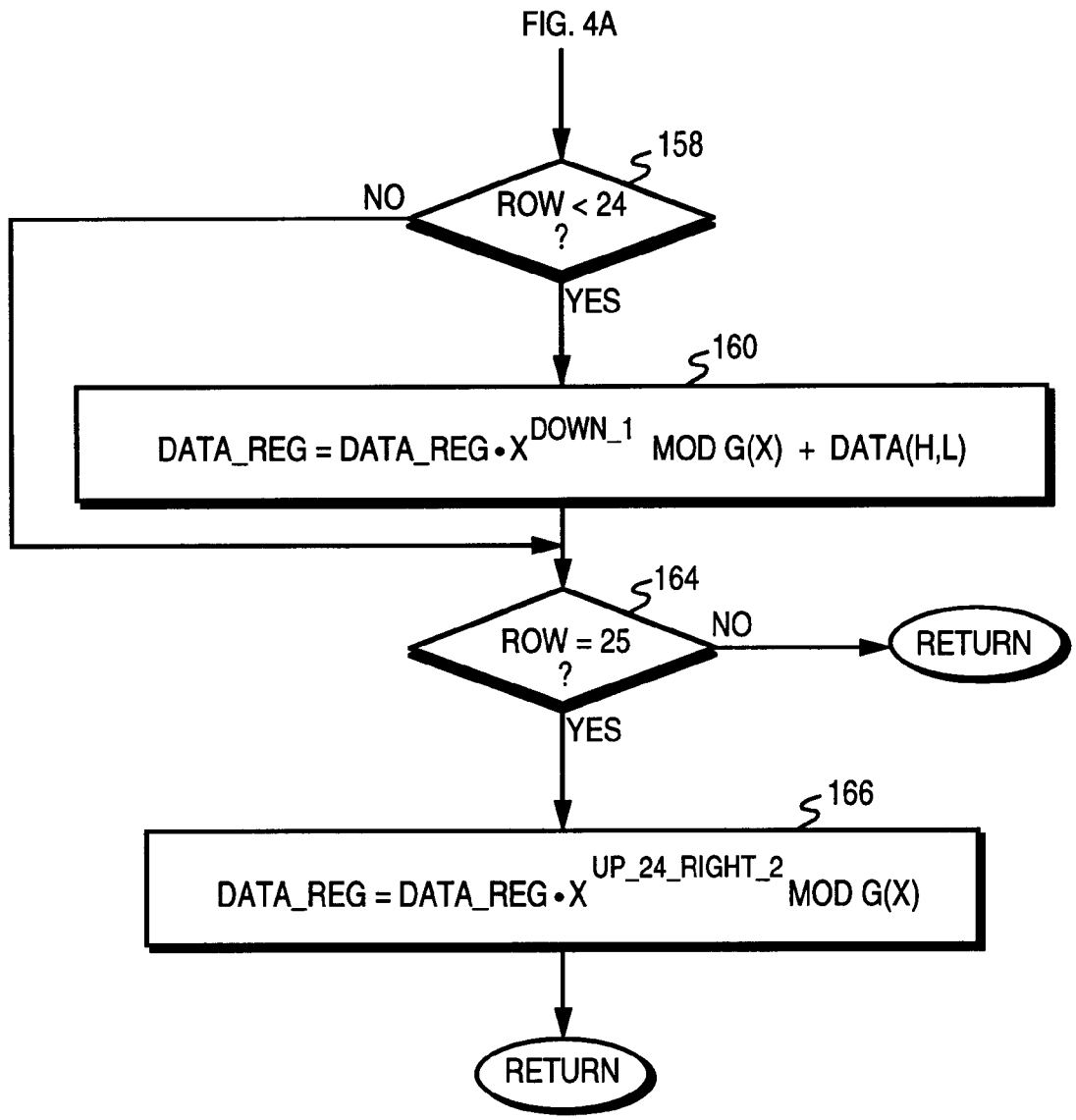
FIG. 4H is the flow diagram for updating the data CRC syndrome during the first pass of the P code words.
Figure 4I:
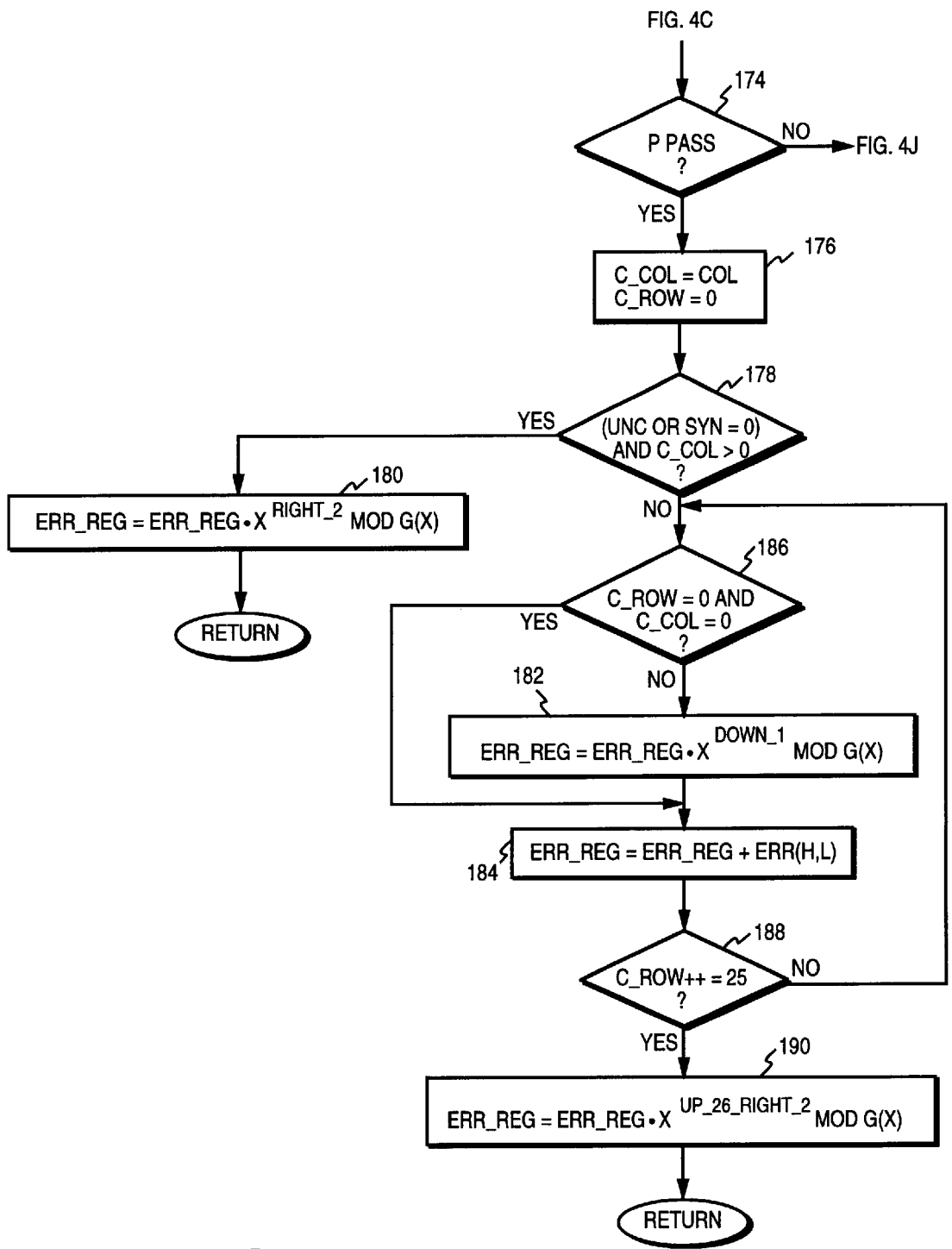
FIG. 4I is a flow diagram for updating the error CRC syndrome during the pass of the P code words.
Figure 4J:
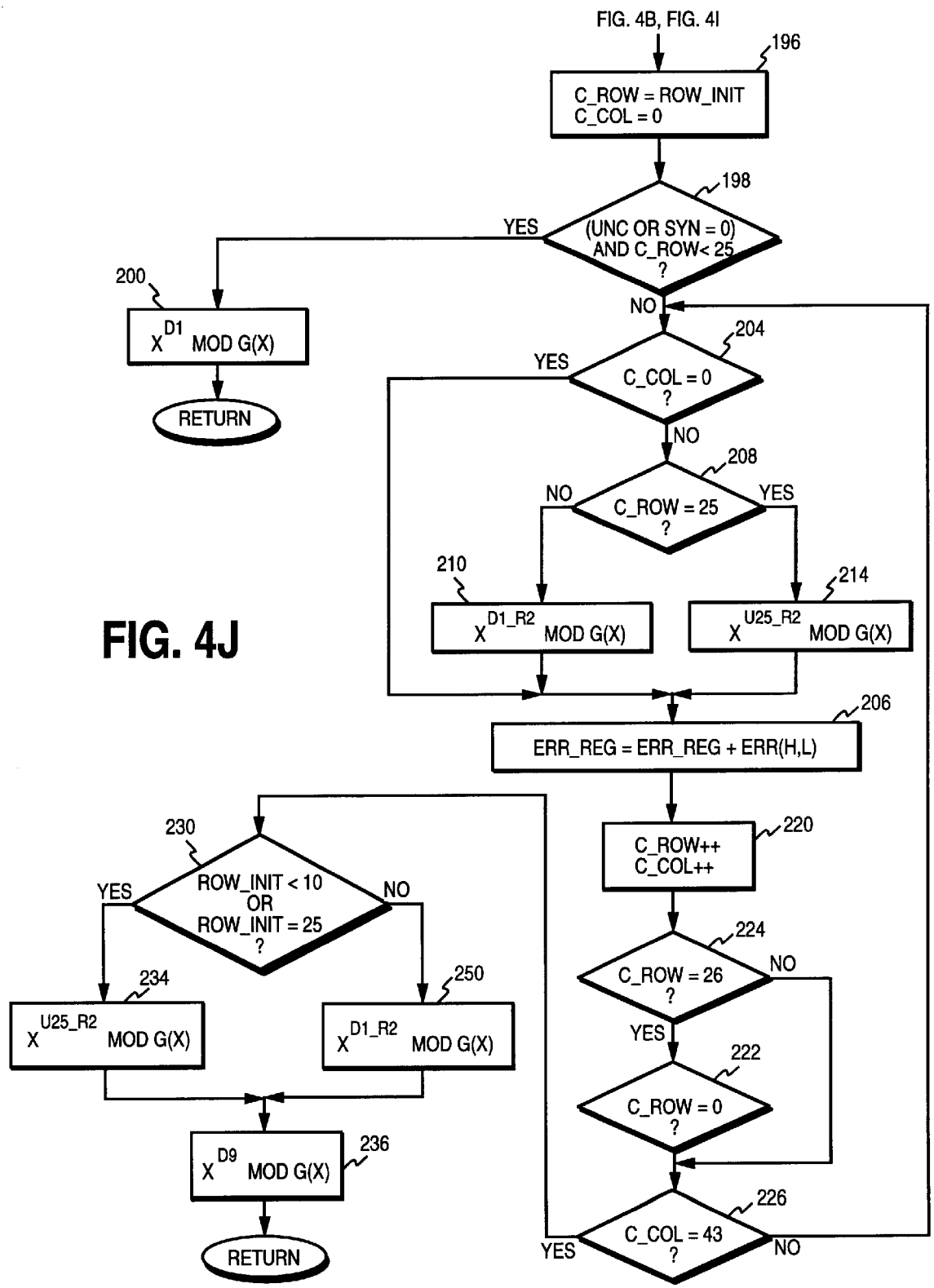
FIG. 4J is a flow diagram for updating the error CRC syndrome during the pass of the Q code words.
Figure 4K:
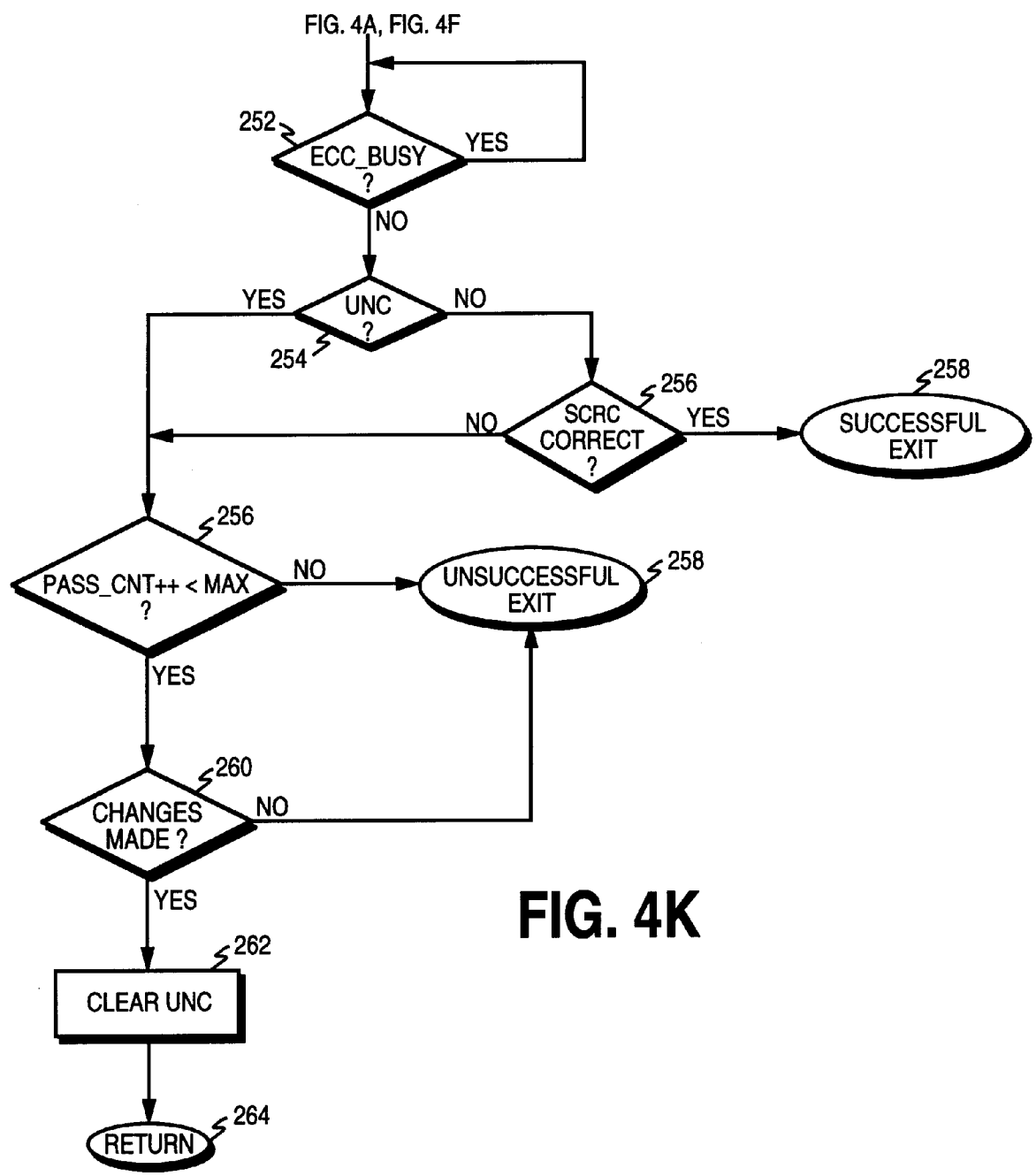
FIG. 4K is a flow diagram executed at the end of each P or Q pass to check whether the corrections are valid and complete using the CRC syndrome $S_{CRC}$.

Once the last P code word has been processed (i.e., COL equals 42 at step 68), then the flow diagram of FIG. 4K is executed to determine whether the corrections to the product code are valid and complete. If not completely corrected, then the flow diagram of FIG. 4B is executed to process the Q code words.

The flow diagram of FIG. 4B for processing the Q code words is essentially the same as the flow diagram of FIG. 4A for processing the P code words. First, a ROW_INIT variable is initialized to the first Q code word (i.e. set to zero at step 70), and thereafter it keeps track of the current Q code word during the Q pass. At step 72, a ROW variable is set to the current Q code word (i.e., to ROW_INIT) and COL is set to 0 (i.e., to the first symbol in the current Q code word). If at step 74 the read flag READ_Q[ROW_INIT] for the current Q code word is set, or if it is the first pass, then a loop is executed to generate the error syndromes for the current Q code word. The current symbol from the current EVEN and ODD Q code word of FIG. 2C (designated H,L) are read from the data buffer 26 of FIG. 3 at step 76 and input into the syndrome generator 29 at step 78. If ROW does not equal 25 at step 80 then ROW is incremented, else ROW is re-initialized to zero (the top row) at step 82, in order to process the next symbol in the current Q code word (see FIG. 5). At the end of the loop, if COL is not at the last symbol of the current Q code word at step 84 (i.e., not 42), then COL is incremented and the loop is re-executed to read the next symbol for use in calculating the error syndromes.

Once all of the symbols have been read for the current Q code word (i.e., COL is 42 at step 84), the syndrome generator 29 of FIG. 3 will have generated the ECC syndromes for the code word. The read flag READ_Q[ROWINIT] is cleared at step 85 so that the current Q code word is skipped during the next Q pass (unless its read flag is set again as described below). If the syndromes are zero at step 86, indicating that the code word is error-free, and it is not the first pass (i.e., FIRST PASS is false at step 88), then the current Q code word pointers are read at step 90. At step 92, the read flags READ_Q[POINTERS] are set for the P code words that intersect the current Q code word at the pointer locations, and the pointers for the current Q code word are then cleared. During the first pass (i.e., when FIRST PASS is true at step 88), the erasure pointers are not changed and the latency in accessing the buffer at step 90 to read the pointers is avoided. In either case, the error CRC syndrome is updated at step 94 to position it over the next Q code word by executing the flow diagram of FIG. 4J described below.

If the syndromes are not zero at step 86, indicating that the Q code word contains errors, then the pointers for the current Q code word are read at step 96. Next the system checks the ECC_BUSY flag at step 98. If set—indicating that the error corrector 30 is busy correcting a previous code word—then the system waits until the ECC_BUSY flag is cleared. Once cleared, the ECC_BUSY flag is set at step 100 to start the error correction procedure for the current Q code word. The error correction procedure is set forth in the flow diagram of FIG. 4C, and it is executed concurrent with generating the syndromes for the next Q code word. In other words, after setting the ECC_BUSY flag at step 98, the syndrome generation procedure of FIG. 4A immediately begins processing the next Q code word while the previous Q code word is corrected by the error corrector 30.

If at step 74 the read flag READ_P[COL] is not set and it is not the first pass, then the current Q code word is skipped and the latency associated with reading the code word from the buffer and generating error syndromes is avoided. However, the error CRC syndrome is still updated at step 94 in order to position it over the next Q code word.

Once the last Q code word has been processed (i.e., ROW_INIT equals 25 at step 102), then the flow diagram of FIG. 4K is executed to determine whether the corrections to the product code are valid and complete. If not completely corrected, then the FIRST PASS flag is cleared at step 103 and another pass over the P code words is performed by re-executing the flow diagram of FIG. 4A.

Continuing now with FIG. 4C, this flow diagram is executed when a P or Q code word contains errors (i.e., the syndromes are non-zero). The flow diagram of FIG. 4C executes concurrently with the flow diagrams of FIG. 4A and FIG. 4B for generating the error syndromes. In other words, if the syndromes generated for a current code word (P or Q) are non-zero, the flow diagram of FIG. 4C is executed to correct the code word while the syndromes are being generated for the next code word. The error correction procedure waits at step 104 until the ECC_BUSY flag is set at step 66 of FIG. 4A or at step 100 of FIG. 4B (i.e., until a P or Q code word needs correcting). To correct a code word, control branches at step 106 depending on the number of pointers set for the code word. After the code word is corrected, the error CRC syndrome is adjusted using the correction values at step 108 by executing the flow diagram of FIG. 4I described in greater detail below. Thereafter the ECC_BUSY flag is cleared at step 110 and control returns to the top of the loop where the system waits for the next code word to correct.

Referring again to the branch at step 106 of FIG. 4C, when no pointers are available, the flow diagram of FIG. 4D is executed. Assuming that a P code word needs correction during a P pass, then if the error syndromes for the P code word are consistent with a single error at step 112, at step 114 the error corrector 30 corrects the error. If C2 pointers are available at step 116 (but cleared), then the read flag READ_X[CORRECTION] (where X is Q for a P pass) is set at step 118 for the Q code word that intersects the P code word at the corrected symbol. If the error syndromes are not consistent with a single error at step 112, then the UNC flag is set at step 120 indicating that the code word is uncorrectable. If the code word is uncorrectable, or if there are no C2 pointers available at step 116, then all of the pointers for the current P code word are set at step 122, and the read flag READ_X[ ] is set for all of the intersecting Q code words at step 124.

Referring again to the branch at step 106 of FIG. 4C, if there is one erasure pointer then the flow diagram of FIG. 4E is executed. Assuming that a P code word needs correction during a P pass, then if the error syndromes are consistent with a single error at step 126 and the error location matches the pointer at step 128, the error corrector 30 corrects the error at step 130 in the current P code word. The pointer is then cleared at step 132 and the read flag READ_X [CORRECTION] is set at step 134 for the Q code word that intersects the current P code word at the corrected symbol. If the error syndromes are not consistent with a single error at step 126 or if the error location does not match the pointer at step 128, then the UNC flag is set at step 136, all of the pointers for the current P code word are set at step 138, and the read flag READ_X[ ] is set for all of the intersecting Q code words at step 140.

Referring again to the branch at step 106 of FIG. 4C, if there are two erasure pointers then the flow diagram of FIG. 4F is executed. Assuming that a P code word needs correction during a P pass, then the symbols of the P code word at the pointer locations are corrected at step 142 and the read flags READ_X[CORRECTIONS] are set for the Q code words that intersect the current P code word at the corrected symbols at step 144. If C2 pointers are available at step 146, then the pointers for the current P code word are cleared at step 148, else the read flag READ_X[CURRENT] for the current P code word is set at step 150. The reason the read flag for the current P code word is set is because if C2 pointers are not available there is a greater chance that there are errors without pointers and a miss-correction occurs. Thus, the pointers are not cleared which allows the next Q pass to correct a possible miss-correction. During the next P pass, the current P code word will be read again, and if the syndromes are zero, the pointers will be cleared.

Referring again to the branch at step 106 of FIG. 4C, if there are three or more erasure pointers then the flow diagram of FIG. 4G is executed. Assuming that a P code word needs correction during a P pass, then the read flags READ_X[POINTERS] are set for the Q code words that intersect the current P code word at the pointers at step 152.

This iterative procedure over the P and Q code words continues until enough pointers are cleared to correct all of the code words (or the number of iterations exceeds the maximum). Again, the entire correction procedure is expedited because only those code words flagged for processing are read from the data buffer. This aspect of the present invention, together with the method for concurrently generating the CRC syndrome $S_{CRC}$ described in the following section, provide a significant performance gain over conventional P/Q decoders.

CRC Syndrome Generation

The CRC generator 32 of FIG. 3 generates the CRC syndrome $S_{CRC}$ concurrent with the syndrome generator 29 generating syndromes during the first P pass, and concurrent with the error corrector 30 correcting errors in the P and Q code words during every P and Q pass. In this manner, the CRC syndrome $S_{CRC}$ is immediately available after each of the P and Q passes for use in checking whether the corrections are valid and complete. Consequently, the additional pass over the product code required by the prior art to determine whether the corrections are complete is avoided, and the additional overhead to generate the CRC syndrome $S_{CRC}$ after correcting the product code is avoided.

Figure 5:
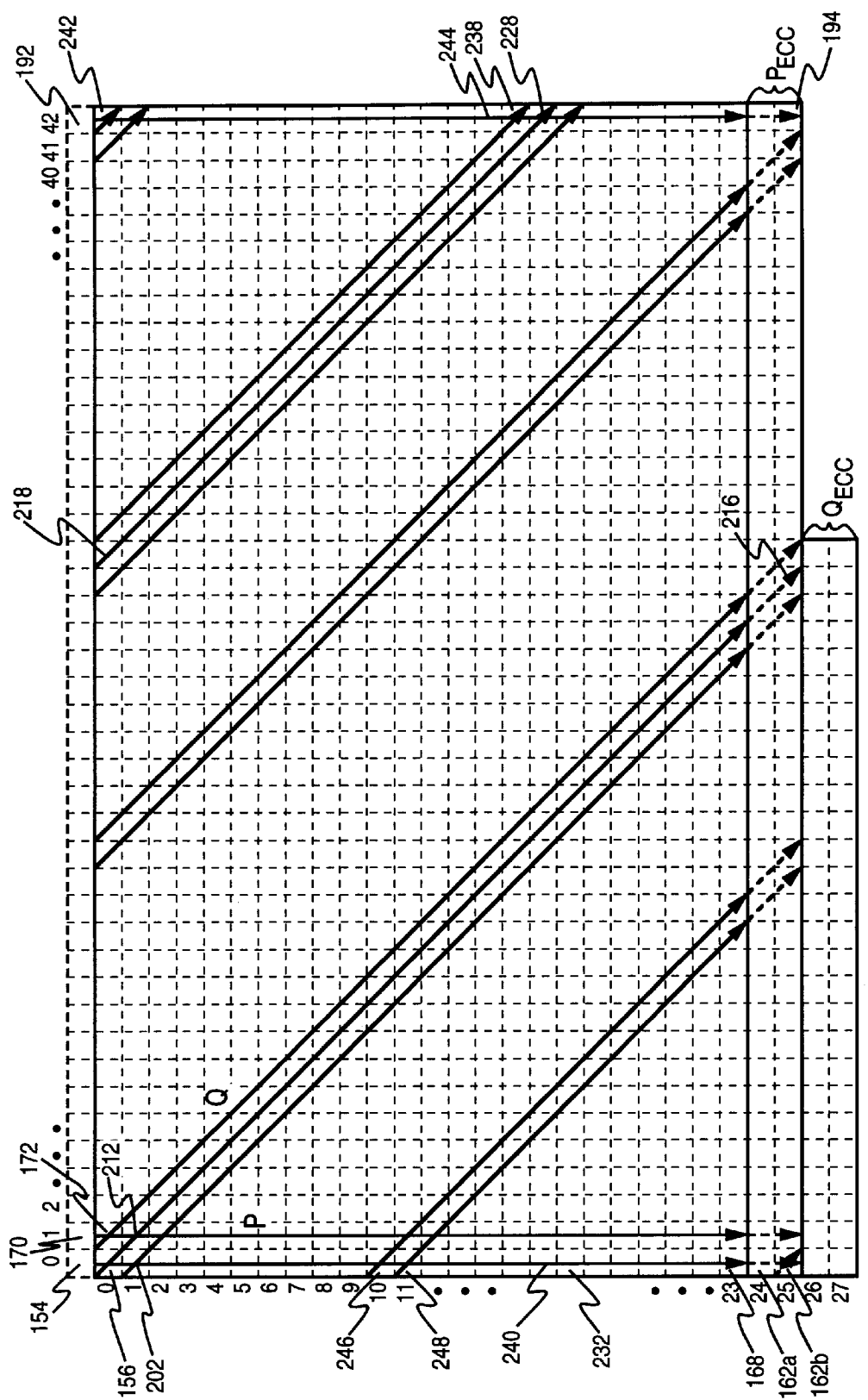
FIG. 5 illustrates the order of processing the P/Q product code and how the validation CRC syndrome $S_{CRC}$ is generated.

The process for generating the CRC syndrome $S_{CRC}$ in real time is understood with reference to FIG. 5. During a read operation, the P/Q decoder 2 of FIG. 1 begins processing a product code stored in the data buffer 26 of FIG. 3 by processing all of the P (or column) code words starting with column 0 154 without regard to the read flags (i.e., no code words are skipped during the first P pass). Then all of the Q (or row) code words are processed starting with row 0 156, where the Q code word comprise symbols across the diagonal of the product code as shown. During subsequent P and Q passes, the P/Q decoder 2 may skip a code word if the read flag for the code word is not set (indicating that processing the code word would be futile).

The CRC syndrome $S_{CRC}$ can be completely generated during the first P pass since all of the symbols of the product code are read. Thereafter, the CRC syndrome $S_{CRC}$ is simply updated to reflect any corrections made to the product code during subsequent P or Q passes. However, since the ECC decoder 2 may skip a code word during a P or Q pass, the position of the CRC syndrome $S_{CRC}$ must be adjusted to account for the skipped code word. Because the syndrome generation process of FIG. 4A and FIG. 4B runs concurrently and asynchronously with the error correction process of FIG. 4C, the present invention employs two CRC syndrome generating circuits: one for computing a "data" CRC syndrome during the first pass of the P code words at step 50 of FIG. 4A, and another for generating an "error" CRC syndrome computed using the correction values generated by the error correction circuit 30 of FIG. 3 during both P and Q passes at step 108 of FIG. 4C. Also, when a code word is skipped, only the error CRC syndrome is adjusted at step 61 of FIG. 4A and at step 94 of FIG. 4B. At the end of the P and Q passes, the data and error CRC syndromes are combined to generate the final CRC syndrome $S_{CRC}$ for use in checking whether the corrections are valid and complete.

The data CRC syndrome is generated completely during the first pass over the P code words in FIG. 4A. At step 50, the data CRC syndrome is adjusted using the current code word symbol by executing the flow diagram shown in FIG. 4H, which is understood with reference to FIG. 5. At the beginning of the first P pass, the data CRC register is positioned to location 154 of FIG. 5, that is, one symbol above the first symbol 156 in the first P code word. At step 44 of FIG. 4A, the first symbol 156 is read from the data buffer 26 and input into the syndrome generator at step 46. At the same time, the first symbol 156 is used to update the data CRC syndrome at step 50 by executing the flow diagram of FIG. 4H. At step 158 of FIG. 4H, ROW is less than 24, so the symbol is added into the data CRC register after adjusting its location from 154 in FIG. 5 to the first symbol 156 of the first P code word. The operation $$DATA\_REG \cdot x^{DOWN-1} \bmod G(x) + DATA(H,L)$$

at step 160 adjusts the data CRC syndrome down one row of symbols to account for the symbols skipped in the data buffer, before adding the P code word symbol DATA(H,L) into the data CRC syndrome. Multiplying the contents of the data CRC register by $x^{DOWN-1} \bmod G(x)$ at step 160 to adjust the data CRC syndrome down one row is described in greater detail below.

Adjusting the data CRC register down one row is necessary because the CRC redundancy is generated during a write operation by processing the header 16 and user data 18 of FIG. 2A as a single code word or polynomial comprising a linear sequence of bits or coefficients. Consequently, during a read operation the CRC syndrome $S_{CRC}$ is generated by treating the data in the product code as a linear code word or polynomial, and dividing it by the CRC generator polynomial G(x). Since the symbols of a P code word reside in the columns of the product code (e.g., in FIG. 2C column 0 or bytes 0000, 0043, 0086, 0129 . . . stores the first P code word), the CRC registers for generating the syndrome must be adjusted to account for the skipped symbols in the buffer. Thus, before adding the next symbol in a P code word to the data CRC syndrome, the data CRC register is adjusted DOWN__1 row of symbols at step 160.

The $P_{ECC}$ redundancy symbols 162a and 162b of a P code word shown in FIG. 5 are not added into the CRC syndrome during a write operation—they are, therefore, skipped during a read operation. When ROW equals 24 at step 158 of FIG. 4H, step 160 is skipped so that the $P_{ECC}$ redundancy 162a and 162b are not added into the data CRC syndrome. When ROW equals the last symbol in the current P code word (i.e., ROW equals 25 at step 164), then at step 166 the data CRC register is multiplied by $$x^{UP\_24\_RIGHT\_2} \text{ MOD } G(x)$$

to adjust the data CRC register from location 168 of FIG. 5, to location 170, that is, to one symbol above the first symbol 172 in the next P code word. The UP__24 offset moves the data CRC syndrome up 24 rows, and the RIGHT__2 offset moves the data CRC syndrome over one column (the offset is RIGHT__2 rather than RIGHT__1 because the data are interleaved to create an EVEN and ODD product code as described above with reference to FIG. 2C).

While processing the P code words, the error syndromes at step 54 of FIG. 4A may be non-zero indicating that the code word contains errors. Therefore, the error correction procedure is started by setting the ECC__BUSY flag at step 66, and the error corrector 30 of FIG. 3 corrects the current P code word asynchronously and concurrently with the syndrome generation for the next P code word. As the P code word is corrected, the correction values are used to update the error CRC syndrome at step 108 of FIG. 4C by executing the flow diagram of FIG. 4I.

In FIG. 4I, at step 174 a branch is taken depending on whether the system is correcting a P or Q code word. Since this is the first pass over the P code words, the flow diagram of FIG. 4I is executed to update the error CRC syndrome accordingly. At step 176, a variable C__COL is set to the current COL (i.e., the P code word being corrected), and a variable C__ROW is set to the first symbol of that code word (i.e., set to zero). Then at step 178 if the UNC flag is set, indicating that the code word was uncorrectable, or if the syndromes are zero, indicating the code word did not contain errors, then the error CRC syndrome is simply adjusted to the next P code word at step 180 by multiplying the error CRC register by $$x^{RIGHT\_2} \text{ MOD } G(x).$$

However, if the code word being corrected at step 178 is the first P code word, it is always processed in order to position the error CRC syndrome over the last symbol (i.e., symbol 162b of FIG. 5)—this reduces the number of tables required to implement the multiply operation $x^K$ MOD G(X) described below.

At the beginning of each pass over the P code words, the error CRC syndrome is positioned to the first symbol in the first P code word (i.e., positioned to symbol 156 of FIG. 5). Thereafter, the error CRC syndrome is positioned to one above the first symbol in the remaining P code words (e.g., the error CRC syndrome is positioned to location 170 before processing the second P code word). Therefore, when processing all but the first P code word, the error CRC syndrome is first adjusted down one row at step 182 before adding the correction value for the first symbol to the error CRC syndrome at step 184. In other words, the branch at step 186 to skip step 182 is taken only for the first symbol in the first P code word (i.e., when C__COL and C__ROW are zero). Thereafter, the error CRC syndrome is always adjusted down one row at step 182 before adding the correction value for the next symbol.

The correction value, designated as ERR(H,L) in step 184, is for the current symbol in the P code word for both the EVEN and ODD product codes. The correction value may be zero (i.e., no correction) or non-zero (i.e., correction made) for either of the symbols of the EVEN and ODD product codes. A correction value is generated for each symbol in the P code words because the error CRC syndrome is "stepped" through each symbol; however, the correction value is zero when processing the $P_{ECC}$ symbols since they are not included in the CRC redundancy during a write operation. After processing all the symbols in the current P code word (i.e., C__ROW equals 25 at step 188), then the error CRC syndrome is adjusted up 26 rows (UP__26) and over one column (RIGHT__2) at step 190 in order to position the error CRC syndrome to one above the first symbol in the next P code word (e.g., from symbol 162b to location 170 of FIG. 5 after processing the first P code word). The flow diagram of FIG. 4I is then executed again to process or skip the next P code word.

The flow diagram of FIG. 4A is re-iterated until all of the P code words have been processed (i.e., until COL equals 42 at step 68). After the first pass over the P code words, generation of the data CRC syndrome is complete. Thus, only the error CRC syndrome is adjusted using the correction values during subsequent P and Q passes. Also after the first P pass, control branches to FIG. 4K to check if the corrections to the product code are valid and complete using the CRC syndrome $S_{CRC}$ (after combining the error and data CRC syndromes). If the corrections are not complete, control branches to FIG. 4B to process the Q code words.

Before starting a Q pass, the error CRC syndrome is adjusted to the first symbol 156 of the first Q code word of FIG. 5. If during the preceding P pass the syndromes for the last P code word are zero (i.e., the read flag for the last P code word is not set and it is not the first P pass at step 42 and the error syndromes are set to zero at step 43 of FIG. 4A) or if the syndromes at step 54 are zero, then the error CRC syndrome is updated at step 61 of FIG. 4A by executing the flow diagram of FIG. 4I. In FIG. 4I, since the syndromes are zero at step 178, then the error CRC syndrome is adjusted to skip the current P code word at step 180 by multiplying the contents of the error CRC register by $$x^{RIGHT\_2} \text{ MOD } G(X).$$

This operation positions the error CRC syndrome from location 192 to location 156 of FIG. 5 (i.e., to the first symbol in the first Q code word). If the syndromes generated for the last P code word at step 54 of FIG. 4A are non-zero, then the error CRC syndrome is updated at step 108 of FIG. 4C. The error CRC register is multiplied by $$x^{UP\_26\_RIGHT\_2} \text{ MOD } G(X)$$

at step 190 of FIG. 4I to position the error CRC syndrome from location 194 to location 156 of FIG. 5.

During a pass over the Q code words, the error CRC syndrome may be updated at step 94 of FIG. 4B if the current Q code word is skipped at step 74, or if the syndromes are zero at step 86. The error CRC syndrome is also updated at step 108 of FIG. 4C if the syndromes are non-zero at step 86 of FIG. 4B. The flow diagram for updating the error CRC syndrome during a Q pass is shown in FIG. 4J. At step 196 a C_ROW variable is set to the current Q code word (i.e., to ROW_INIT) and a C_COL variable is set to 0 (i.e., to the first symbol in the current Q code word). At step 198, if the UNC flag is set indicating that the current Q code word is uncorrectable or if the syndromes for the code word are zero and the code word is not the last Q code word (i.e., C_ROW<25), then the current Q code word is skipped at step 200 by multiplying the error CRC register by $$x^{DOWN\_1} \text{ MOD } G(X).$$

For instance, if the first Q code word is skipped, then the multiply at step 200 positions the error CRC syndrome from location 156 to location 202 of FIG. 5 (i.e., to the first symbol in the next Q code word). The error CRC syndrome is always stepped through the last Q code word (ROW_INIT=25) in order to reduce the number of tables needed to implement the $x^k$ MOD G(X) multiplications described below.

If at step 198 the UNC flag is not set and the syndromes for the current Q code word are not zero, or if it is the last Q code word, then the error CRC syndrome is stepped through the Q code word and updated with the correction values similar to the P pass described above with reference to FIG. 4I. In contrast to the P pass, the error CRC syndrome is always positioned over the first symbol of each Q code word. Thus, if at step 204 C_COL is zero, the error CRC syndrome is not adjusted and the correction value is simply added into the error CRC register at step 206. If C_COL is not zero at step 204 (i.e., not at the first symbol), then the error CRC syndrome is adjusted depending on its current location. If C_ROW is not 25 at step 208, then the error CRC syndrome is adjusted to the next symbol of the Q code word at step 210 by multiplying the contents of the error CRC register by $$x^{DOWN\_1\_RIGHT\_2} \text{ MOD } G(X).$$

For example, if the error CRC syndrome is positioned over the first symbol 156 of the first Q code word of FIG. 5, then the above multiplication positions the error CRC syndrome to the next symbol 212 of the first Q code word. If C_ROW is 25 at step 208, then error CRC syndrome is adjusted to the next symbol of the Q code word at step 214 by multiplying the contents of the error CRC register by $$x^{UP\_25\_RIGHT\_2} \text{ MOD } G(X).$$

For example, when C_ROW equals 25 when processing the first Q code word of FIG. 5, the error CRC syndrome is adjusted from location 216 to location 218. Again, at step 206 the correction value may be zero or non-zero for either or both of the EVEN and ODD Q code words, and the correction values are always zero when processing the $P_{ECC}$ and $Q_{ECC}$ symbols since they are not included in the CRC redundancy. At step 220 C_ROW and C_COL are incremented and C_ROW is reset to zero at step 222 if C_ROW is 26 at step 224.

This process is repeated until the last symbol for the current Q code word has been processed (i.e., C_COL equals 43 at step 226). At this point, the error CRC syndrome is repositioned over the first symbol of the next Q code word. The adjustment to the error CRC register depends on the current Q code word. For Q codewords 0 through 9 of FIG. 5, the last symbol locations are at 228 through 194, respectively. Therefore, if at step 230 ROW_INIT is less than 10, the adjustment to the error CRC register is RIGHT_2_UP_16. For example, the RIGHT_2 offset will position the error CRC syndrome from location 228 to location 232 of FIG. 5, and the UP_16 offset will position the error CRC syndrome from location 232 to location 202 (i.e., to the first symbol in the next Q code word). In order to reduce the number of tables required to implement the $x^k$ MOD G(X) multiplication, the RIGHT_2_UP_16 adjustment is carried out in two steps by first multiplying the error CRC register at step 234 by $$x^{UP\_25\_RIGHT\_2} \text{ MOD } G(X)$$

and then multiplying the error CRC register at step 236 by $$x^{DOWN\_9} \text{ MOD } G(X).$$

If the current Q code word (ROW_INIT) is 10 to 24 at step 230, then the last symbol in the current Q code word is at locations 242 to 244 of FIG. 5, respectively. In this case, the adjustment to the error CRC syndrome to position it over the first symbol of the next Q code word is RIGHT_2_DOWN_10. For example, if the current Q code word is 10, then the first symbol is at 246 and the last symbol is at 242 of FIG. 5. The RIGHT_2 offset positions the error CRC syndrome from location 242 to location 202, and the DOWN_10 offset positions the error CRC syndrome from location 202 to location 248 (i.e., to the first symbol in the next Q code word). Again, to reduce the size of the tables required to implement the $x^k$ MOD G(X) multiplication, the RIGHT_2_DOWN_10 adjustment is carried out in two steps by first multiplying the error CRC register at step 250 by $$x^{DOWN\_1\_RIGHT2} \text{ MOD } G(X)$$

and then multiplying the error CRC register at step 236 by $$x^{DOWN\_9} \text{ MOD } G(X).$$

The RIGHT_2_UP_16 offset described above is the same adjustment made to the error CRC syndrome at the end of the last Q code word before starting another P pass. That is, the RIGHT_2 offset positions the error CRC syndrome from location 238 to location 240, and the UP_16 offset positions the error CRC syndrome from location 240 to location 156 of FIG. 5 (i.e., to the first symbol in the first P code word). Thus, when ROW_INIT equals 25 at step 230, the multiplications at step 234 and 236 perform the RIGHT_2_UP_16 adjustment to the error CRC syndrome to position it over the first symbol of the first P code word.

At the end of each pass over the P and Q code words, the flow diagram of FIG. 4K is executed to determine whether the product code has been completely corrected or if it is uncorrectable. At step 252, the system waits for the ECC_BUSY flag to clear before performing the CRC check. If the uncorrectable error flag UNC is not set at step 254, indicating that an uncorrectable error was not encountered during the previous P or Q pass, then the CRC syndrome $S_{CRC}$ will indicate whether the corrections made to the product code are valid and complete. Because the CRC syndrome $S_{CRC}$ is generated concurrent with the processing of the P and Q code words, at the end of the P and Q passes the CRC syndrome $S_{CRC}$ is immediately available for use in verifying the corrections made by the P/Q decoder 2. If the CRC syndrome $S_{CRC}$ is correct at step 256, then the correction procedure exits successfully at step 258 without making any additional passes as is required by the prior art.

If the UNC flag is set at step 254, then the pass count variable PASS_CNT is incremented at step 256, and if PASS_CNT exceeds a predetermined maximum, the product code is uncorrectable and the correction procedure exits unsuccessfully at step 258. If the PASS_CNT is less than the maximum at step 256, then if no changes were made at step 260 (no corrections and no pointers changed) during the P and Q pass, the correction procedure again exits unsuccessfully at step 258 since additional passes will be to no avail. Otherwise, the UNC flag is cleared at step 262 and the correction procedure continues at step 264 by executing another P or Q pass.

Because the CRC syndrome $S_{CRC}$ is computed concurrent with correcting the P and Q code words, the correction procedure may terminate successfully at the end of either a P or Q pass. Consequently, the present invention avoids the additional pass required by the prior art to determine whether the correction is complete. Furthermore, the present invention avoids the additional pass required by the prior art to generate the CRC syndrome $S_{CRC}$ at the end of the correction process. Thus, the present invention provides a significant improvement over the prior art by significantly increasing the throughput of the EDAC system for optical storage devices.

CRC Syndrome Generator

Figure 6:
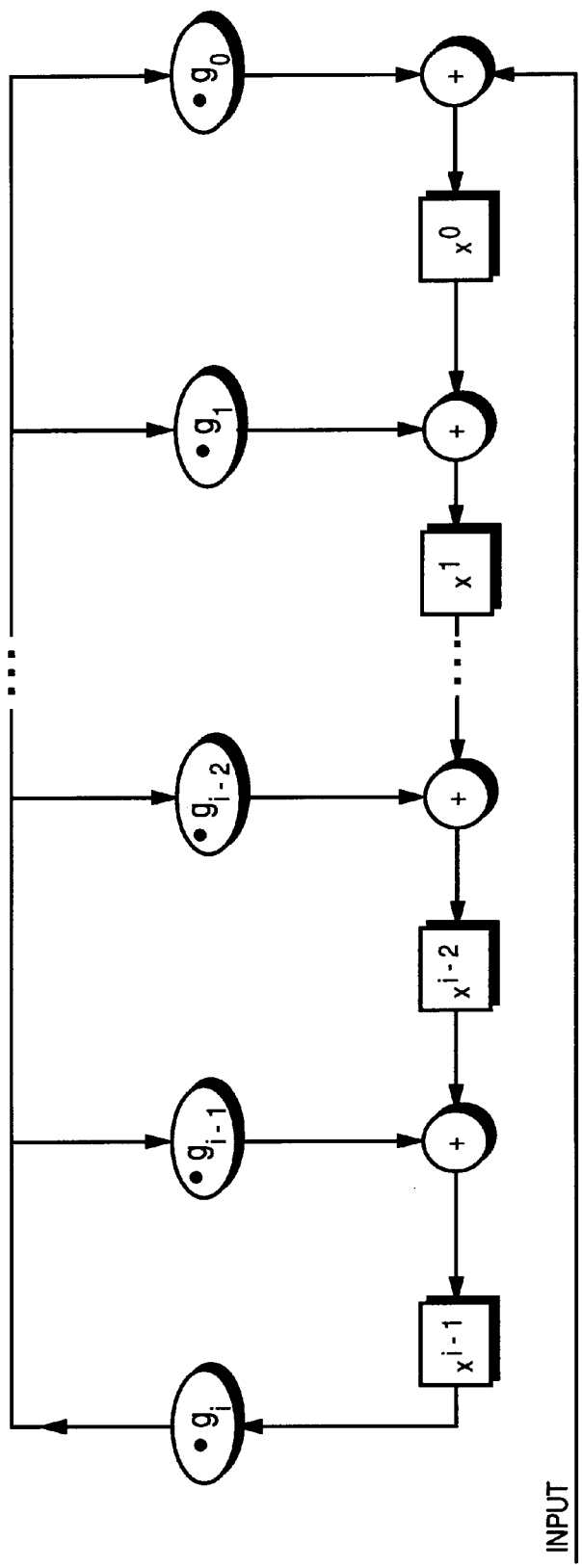
FIG. 6 is a conventional linear feedback shift register (LFSR) for use in generating the CRC redundancy during a write operation, and the CRC syndrome during a read operation.

The CRC generator 32 of FIG. 3 generates the CRC redundancy 20 for the sector shown in FIG. 2A during a write operation, and it generates the CRC syndrome $S_{CRC}$ during a read operation for use in validating the corrections made by the error corrector 30 as described above with reference to FIGS. 6A–6E. FIG. 6 shows a conventional linear feedback shift register (LSFR) for generating the CRC redundancy 20 during a write operation. Operation of the LFSR shown in FIG. 6 is well known-it divides an input polynomial D(x) by a generator polynomial G(x):

$$G(x) = g_i x^i + g_{i-1} x^{i-1} + \ldots + g_1 x + g_0.$$

The coefficients of the input polynomial D(x) are shifted serially through the LFSR, where the number of shifts equals the degree of the input polynomial plus one. The remainder, or CRC redundancy, is the final state of the shift register. To generate the CRC redundancy 20 for the sector shown in FIG. 2A, the k bits of the header 16 and user data 18 are represented as the coefficients of a polynomial P(x). The CRC redundancy is then computed as:

$$CRC\ \text{redundancy} = P(x) \cdot x^{n-k} \bmod G(x),$$

where n−k is the number of CRC redundancy symbols and G(x) is the generator polynomial. The contents of the register after the final shift is the CRC redundancy 20, which is then appended to the user data as shown in FIG. 2A before the resulting code word is written to the disk.

During a read operation, the data read from the disk are processed to generate a CRC syndrome $S_{CRC}$ according to:

$$CRC\ \text{syndrome}\ S_{CRC} = C(x) \bmod G(x),$$

where C(x) is the data polynomial or code word (including the CRC redundancy) read from the disk. In the prior art, the code word of FIG. 2A is read from the data buffer 26 of FIG. 3 in a serial manner after the error corrector 30 finishes making corrections. Therefore, the same LFSR circuit of FIG. 6 is used to generate the CRC syndrome $S_{CRC}$ according to the above equation.

In the present invention, the CRC syndrome $S_{CRC}$ is generated concurrent with correcting the code word as described above with reference to FIGS. 4A–4K. Therefore, the LFSR circuit of FIG. 6 cannot be used to generate the CRC syndrome $S_{CRC}$ because the code word is not processed as a series of consecutive bits. An overview of the CRC syndrome generator of the present invention is provided before describing how it generates the CRC syndrome $S_{CRC}$.

Figure 7:
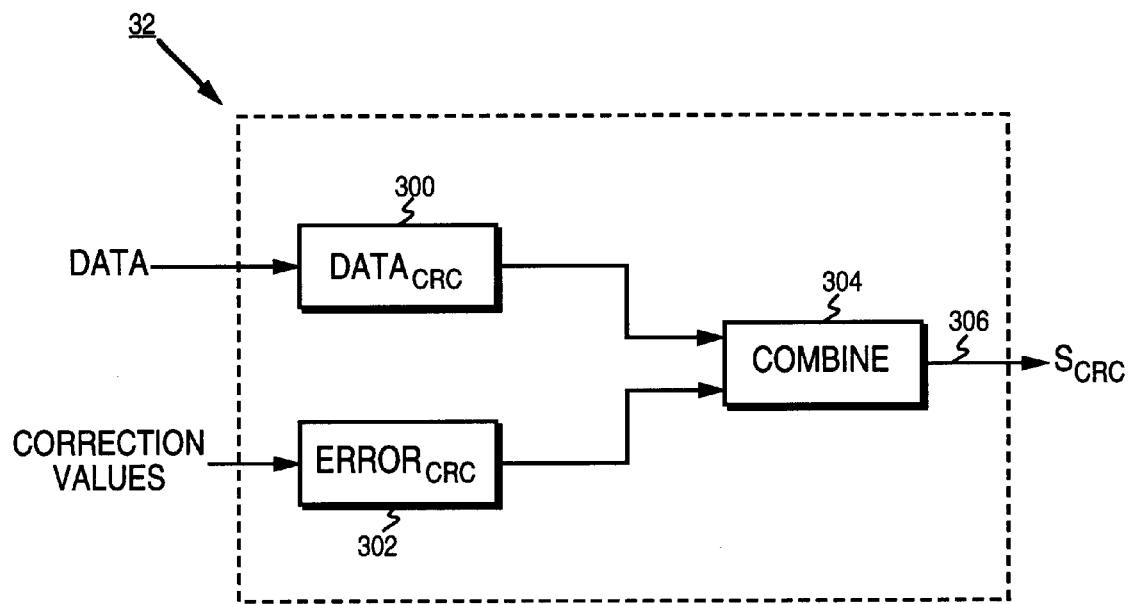
FIG. 7 is a block diagram of the CRC correction validation circuit comprising a $DATA_{CRC}$ circuit for computing the DATA part of the CRC syndrome, an $ERROR_{CRC}$ circuit for computing the ERROR part of the CRC syndrome, and a circuit for combining the DATA and ERROR registers to generate the final CRC syndrome $S_{CRC}$.

FIG. 7 shows a block diagram of the CRC syndrome generator 32 of FIG. 3, which is comprised of a $DATA_{CRC}$ circuit 300 and an $ERROR_{CRC}$ circuit 302. As described above with reference to FIG. 4A, the $DATA_{CRC}$ is generated at step 50 during the first P pass over the product code of FIG. 2C using the uncorrected data read from the data buffer 26 of FIG. 3. The $ERROR_{CRC}$ is generated using the correction values generated by the error corrector 30 during the iterative processing of the P and Q code words. At the end of the P and Q passes, the $DATA_{CRC}$ and the $ERROR_{CRC}$ are combined by COMBINE circuit 304 to generate a final CRC syndrome $S_{CRC}$ 306 which is compared to a predetermined correct value at step 256 of FIG. 4K to determine whether the corrections to the P and Q code words are valid and complete. The mathematical function performed by the COMBINE circuit 304 is a simple exclusive-or of the $DATA_{CRC}$ and $ERROR_{CRC}$.

Figure 8:
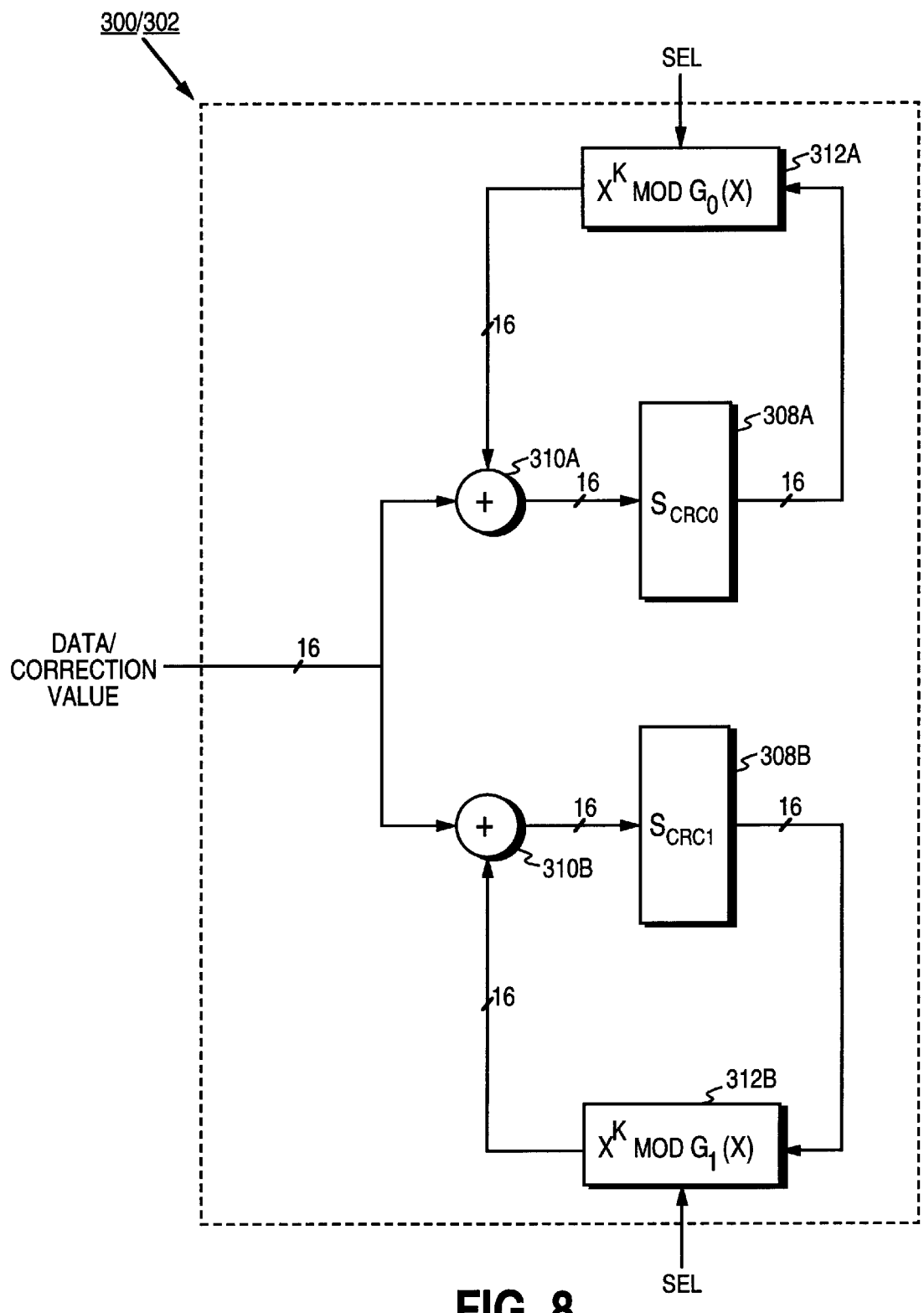
FIG. 8 is a detailed block diagram of the $DATA_{CRC}/ERROR_{CRC}$ circuits of FIG. 8.

A more detailed depiction of the $DATA_{CRC}$ 300 and the $ERROR_{CRC}$ 302 circuits of FIG. 7 is shown in FIG. 8. In the preferred embodiment, the CRC syndrome generator polynomial G(x) is of degree 32, but it is factored into two polynomials $G_0(x)$ and $G_1(x)$ each of degree 16 in order to simplify the implementation. The $DATA_{CRC}$ 300 and the $ERROR_{CRC}$ 302 circuits of FIG. 7 generate the CRC syndrome $S_{CRC}$ by representing the code word polynomial C(x) of FIG. 2A as the linear combination of a plurality of subset polynomials:

$$C(X) = C_j(x) + C_{j-1}(x) + \ldots + C_0(x),$$

where each subset polynomial $C_k(x)$ comprises a predetermined number of bits from the code word polynomial C(x). In the embodiment disclosed herein, each subset polynomial comprises 16 bits of the code word polynomial C(x), such that in hexadecimal representation:

| | |
|---|---|
| $C_0(x)$ | $= 00000000\ldots00000000xxxx\ +$ |
| $C_1(x)$ | $= 00000000\ldots0000xxxx0000\ +$ |
| $C_2(x)$ | $= 00000000\ldots xxxx00000000\ +$ |
| | $\ldots\ +$ |
| $C_{j-1}(x)$ | $= 0000xxxx\ldots000000000000\ +$ |
| $C_j(x)$ | $= xxxx0000\ldots000000000000\ =$ |
| $C(x)$ | $= xxxxxxxx\ldots xxxxxxxxxxxx.$ |

In this manner, the CRC syndrome $S_{CRC}$ can be generated conceptually as the linear combination of the CRC syndrome for each subset polynomial:

$$CRC\ \text{syndrome}\ S_{CRC} = C_0(x) \bmod G(x) + C_1(x) \bmod G(x) + \ldots + C_j(x) \bmod G(x).$$

The above equation can be re-arranged into:

$$\text{CRC syndrome } S_{CRC} = \overline{C}_0(x) \cdot x^{16 \cdot 0} \bmod G(x) + \overline{C}_1(x) \cdot x^{16 \cdot 1} \bmod G(x) + \ldots + \overline{C}_j(x) \cdot x^{16 \cdot j} \bmod G(x).$$

where $\overline{C}_k(x)$ are the 16 bit polynomials out of the code word $C(x)$ (i.e., $\overline{C}_k(x) = C_k(x) \cdot x^{-16k}$). Another mathematical relationship exploited by the present invention is:

$$\overline{C}_k(x) \cdot x^{n+m} \bmod G(x) = (\overline{C}_k(x) \cdot x^n \bmod G(x)) \cdot x^m \bmod G(x).$$

Referring again to FIG. 5, using the above equations the CRC syndrome can be computed for the first byte 156 of the EVEN and ODD product codes of FIG. 2C during the first pass over the P code words. The byte 156 from the EVEN and ODD product codes comprise the most significant coefficients of the above code word C(x) as well as the non-zero coefficients of the above subset polynomial $C_j(x)$. Referring again to FIG. 8, the first byte 256 from the EVEN and ODD code words of FIG. 2C are loaded into the 16 bit registers 308A and 308B (after adding zero at adders 310A and 310B). Then when the next byte 202 of the EVEN and ODD P code word is read, the content of the registers 308A and 308B are multiplied by $x^K \bmod G(x)$ at multipliers 312A and 312B, where K equals one row of bits (DOWN_1). The result of the multiplication is then reloaded into the registers 308A and 308B (after adding the next byte 202 of the EVEN and ODD P code word at adders 310A and 310B which starts the CRC syndrome computation for that particular subset polynomial). This computation is performed for the remaining bytes until the last byte 168 of the first P code word has been read. The CRC syndrome is then adjusted to location 170 of FIG. 5 by multiplying the content of registers 308A and 308B by $x^K \bmod G(x)$, where K equals up 24 rows and right 1 column (i.e., K=UP_24_RIGHT_2 at step 166 in FIG. 4H described above). The controller 28 of FIG. 3 selects the appropriate value for the offset value K via a SEL control line for the multipliers 312A and 312B. This process continues until the last symbol of the last P code word of FIG. 5 has been read, wherein the registers 308A and 308B will contain the CRC syndrome for the first two bytes of the entire code word C(x) (i.e., for the subset polynomial $C_j(x)$), added to the CRC syndromes computed for the other bytes (i.e., the other subset polynomials), thereby generating the data CRC syndrome for the entire code word C(x).

The $\text{ERROR}_{CRC}$ circuit 302 of FIG. 7 for generating the error CRC also comprises the circuitry of FIG. 8. When a correction value is generated by the error corrector 30 of FIG. 3, the correction value is added into the registers 308A and 308B at adders 310A and 310B. The multipliers 312A and 312B continue to multiply the content of the registers 308A and 308B by the appropriate K offset as each symbol in a P or Q code word is processed, regardless as to whether a correction value is generated, or if the P or Q code word is skipped as described above. At the end of the P and Q passes, the data CRC and the error CRC are combined to generate the final CRC syndrome $S_{CRC}$ for use in determining whether the corrections are valid and complete at step 256 of FIG. 4K.

Figure 9:
FIG. 9 shows the general form of a matrix for computing the multiplier $x^K$ MOD $G(x)$ shown in FIG. 8.

The preferred embodiment for implementing the $x^K \bmod G(X)$ multipliers 312A and 312B of FIG. 8 is understood with reference to FIG. 9. FIG. 9 represents a table of remainders generated by the computation:

$$x^{K+i} \bmod G(x),$$

where i equals {0.15}. The table of FIG. 9 is generated for each of the K offset value used during the computation of the CRC syndrome. The multiply operation is then carried out by multiplying the content of registers 308A and 308B of FIG. 8 by the appropriate table (i.e., by multiplying a 16-bit vector by a 16×16 matrix).

The actual tables for implementing the $x^K \bmod G(x)$ multiply for the two factored 16-bit CRC generators $G_0(x)$ and $G_1(X)$ are shown in the VHDL source code of Appendix 1. The first set of tables implement the $x^K \bmod G(X)$ multiplies during the first pass of the P code words. The table labeled row1_tbl, for example, implements the DOWN_1 offset for the first CRC generator $G_0(x)$, and the table row2_table implements the DOWN_1 offset for the second CRC generator $G_1(x)$. Similarly, the tables col1_tbl and col2_tbl implement the UP_24_RIGHT_2 offset for the first and second CRC generators, respectively. The second set of tables in the VHDL code implement the $x^K \bmod G(X)$ multiplies during subsequent passes over the P and Q code words (i.e., when only the error CRC syndrome is updated). The labels for these tables are self explanatory. For example, the tables labeled r2_1_tbl and r2_2_tbl implement the RIGHT_2 offset for the first and second CRC generators, respectively.

The remainder of the VHDL source code in Appendix 1 carries out the actual multiply operation by multiplying the content of registers 308A and 308B of FIG. 8 by the appropriate table (i.e., by multiplying a 16-bit vector by a 16×16 matrix). The product of the input register or vector and the matrix is an output vector, where each element in the output vector is generated by summing the products of the n elements of the ith row of the table (or matrix) with the corresponding components of the register (or column input vector). This sum can be written as:

$$y_i = \sum_{k=0}^{15} a_{ik} x_k$$

where $y_i$ is the output vector of the multipliers 312A and 312B, $a_{ik}$ are the 16 bits of the ith row of the table of FIG. 9, and $x_k$ are the 16 bits stored in the register 308A and 308B. The output vector $y_i$ from the multipliers 312A and 312B are added to the input bits at adders 310A and 310B, and the result is restored to the registers 308A and 308B.

The objects of the invention have been fully realized through the embodiments disclosed herein. Those skilled in the art will appreciate that the aspects of the invention can be achieved through various other embodiments without departing from the essential function. The particular embodiments disclosed are illustrative and not meant to limit the scope of the invention as appropriately construed by the following claims.

APPENDIX 1

-- VHDL Model Created from SGE Symbol edc_dat.sym -- Sep 12 11:29:44 1996
library IEEE;
use IEEE.std_logic_1164.all;

APPENDIX 1-continued

```
use IEEE.std_logic_arith.all;
                                    FIRST PASS
entity EDC_DAT is
    Port (
        CLK : In    std_logic;
        DI : In     std_logic_vector (7 downto 0);
        LOW : In    std_logic;
        RST : In    std_logic;
        SEL : In    std_logic_vector (1 downto 0);
        DO : Out    std_logic_vector (31 downto 0) );
end EDC_DAT;
architecture BEHAVIORAL of EDC_DAT is
    type array_16x16 IS array (0 to 15) of std_logic_vector(15 downto 0);
    constant row1_tbl : array_16x16 := (
-- 15      out      0
    "0111010101010011",     -- 0
    "1110101010100110",
    "0101010101001001",
    "1010101010010010",
    "1101010100100001",
    "0010101001000111",
    "0101010010001110",
    "1010100100011100",     -- in
    "1101001000111101",
    "0010010001111111",
    "0100100011111110",
    "1001000111111100",
    "1010001111111101",
    "1100011111111111",
    "0000111111111011",
    "0001111111110110");    -- 15
    constant col1_tbl : array_16x16 := (
    "1110110101101110",
    "0101101011011001",
    "1011010110110010",
    "1110101101100001",
    "0101011011000111",
    "1010110110001110",
    "1101101100011001",
    "0011011000110111",
    "0110110001101110",
    "1101100011011100",
    "0011000110111101",
    "0110001101111010",
    "1100011011110100",
    "0000110111101101",
    "0001101111011010",
    "0011011110110100");
    constant row2_tbl : array_16x16 := (
    "1011100010000011",
    "0111000100000001",
    "1110001000000010",
    "1100010000000011",
            if (r1(i)='1') then
                sumr := sumr xor row1_tbl(i);
                sumc := sumc xor col1_tbl(i);
            end if;
        end loop;
        row1 <= sumr;
        col1 <= sumc;
    end process;
    process (r2)
        variable sumr : std_logic_vector(15 downto 0);
        variable sumc : std_logic_vector(15 downto 0);
    begin
        sumr := "0000000000000000";
        sumc := "0000000000000000";
        for i in 0 to 15 loop
            if (r2(i)='1') then
                sumr := sumr xor row2_tbl(i);
                sumc := sumc xor col2_tbl(i);
            end if;
        end loop;
        row2 <= sumr;
        col2 <= sumc;
    end process;
    di_mux <= DI(0) & DI(1) & DI(2) & DI(3) & DI(4) & DI(5) & DI(6) & DI(7) &
        "00000000" when LOW='0' else
        "00000000" & DI(0) & DI(1) & DI(2) & DI(3) & DI(4) & DI(5) & DI(6) & DI(7);
```

APPENDIX 1-continued

```
    r1in <= r1 when SEL="00" else row1 when SEL="01" else
        col1 when SEL="10" else r1 xor di_mux;
    r2in <= when SEL="00" else row2 when SEL="01" else
        col2 when SEL="10" else r2 xor di_mux;
    process
    begin
        wait until (CLK'event) and (CLK='1');
        if (RST='1') then
            r1 <= "0000000000000000";
            r2 <= "0000000000000000";
        else
            r1 <= r1in;
            r2 <= r2in;
        end if;
    end process;
    DO <= r2 & r1;
end BEHAVIORAL;
-- VHDL Model Created from SGE Symbol edc_err.sym -- Sep 26 17:10:54 1996
library IEEE;
use IEEE.std_logic_1164.all;
use IEEE.std_logic_arith.all;
                            SUBSEQUENT P AND Q PASSES
entity EDC_ERR is
    Port (
        CLK : In    std_logic;
        DI0 : In    std_logic_vector (7 downto 0);
        DI1 : In    std_logic_vector (7 downto 0);
        RST : In    std_logic;
        SEL : In    std_logic_vector (2 downto 0);
        DO : Out    std_logic_vector (31 downto 0) );
end EDC_ERR;
architecture BEHAVIORAL of EDC_ERR is
    type array_16x16 IS array (0 to 15) of std_logic_vector(15 downto 0);
    constant r2_1_tbl : array_16x16 := (
    "1000000000000101",
    "1000000000001111",
    "1000000000011011",
    "1000000000110011",
    "1000000001100011",
    "1000000011000011",
    "1000000110000011",
    "1000001100000011",
    "1000011000000011",
    "1000110000000011",
    "1001100000000011",
    "1011000000000011",
    "1110000000000011",
    "0100000000000011",
    "1000000000000110",
    "1000000000001001");
    constant d1_1_tbl : array_16x16 := (
    "0111010101010011",
    "1110101010100110",
    "0101010101001001",
    "1010101010010010",
    "1101010100100001",
    "0010101001000111",
    "0101010010001110",
    "1010100100011100",
    "1101001000111101",
    "0010010001111111",
    "0100100011111110",
    "1001000111111100",
    "1010001111111101",
    "1100011111111111",
    "0000111111111011",
    "0001111111110110");
    constant d1r2_1_tbl : array 16x16 := (
    "0011111111101100",
    "0111111111011000",
    "1111111110110000",
    "0111111101100101",
    "1111111011001010",
    "0111110110010001",
    "1111101100100010",
    "0111011001000001",
    "1110110010000010",
    "0101100100000001",
    "1011001000000010",
```

APPENDIX 1-continued

```
    "1110010000000001",
    "0100100000000111",
    "1001000000001110",
    "1010000000011001",
    "1100000000110111");
    constant d9_1_tbl : array_16×16 := (
-- h poly-out      1
    "0000001001010011",     -- 1
    "0000010010100110",
    "0000100101001100",
    "0001001010011000",
    "0010010100110000",     -- poly-in
    "0100101001100000",
    "1001010011000000",
    "1010100110000101",
    "1101001100001111",
    "0010011000011011",
    "0100110000110110",
    "1001100001101100",
    "1011000011011101",
    "1110000110111111",
    "0100001101111011",
    "1000011011110110");    -- h
    constant u25r2_1_tbl : array 16×16 := (
    "1010000000001011",
    "1100000000010011",
    "0000000000100011",
    "0000000001000110",
    "0000000010001100",
    "0000000100011000",
    "0000001000110000",
    "0000010001100000",
    "0000100011000000",
    "0001000110000000",
    "0010001100000000",
    "0100011000000000",
    "1000110000000000",
    "1001100000000101",
    "1011000000001111",
    "1110000000011011");
    constant u26r2_1_tbl : array 16×16 := (
    "0010100010100001",
    "0101000101000010",
    "1010001010000100",
    "1100010100001101",
    "0000101000011111",
    "0001010000111110",
    "0010100001111100",
    "0101000011111000",
    "1010000111110000",
    "1100001111100101",
    "0000011111001111",
    "0000111110011110",
    "0001111100111100",
    "0011111001111000",
    "0111110011110000",
    "1111100111100000");
    constant r2_2_tbl : array_16×16 := (
    "0000000000000111",
    "0000000000001110",
    "0000000000011100",
    "0000000000111000",
    "0000000001110000",
    "0000000011100000",
    "0000000111000000",
    "0000001110000000",
    "0000011100000000",
    "0000111000000000",
    "0001110000000000",
    "0011100000000000",
    "0111000000000000",
    "1110000000000000",
    "1100000000000111",
    "1000000000001001");
    constant d1_2_tbl : array_16×16 := (
    "1011100010000011",
    "0111000100000001",
    "1110001000000010",
    "1100010000000011",
```

APPENDIX 1-continued

```
    "1000100000000001",
    "0001000000000101",
    "0010000000001010",
    "0100000000010100",
    "1000000000101000",
    "0000000001010111",
    "0000000010101110",
    "0000000101011100",
    "0000001010111000",
    "0000010101110000",
    "0000101011100000",
    "0001010111000000");
  constant d1r2_2_tbl : array_16x16 := (
    "0010101110000000",
    "0101011100000000",
    "1010111000000000",
    "0101110000000111",
    "1011100000001110",
    "0111000000011011",
    "1110000000110110",
    "1100000001101011",
    "1000000011010001",
    "0000000110100101",
    "0000001101001010",
    "0000011010010100",
    "0000110100101000",
    "0001101001010000",
    "0011010010100000",
    "0110100101000000");
  constant d9_2_tbl : array_16x16 := (
-- h poly-out    1
    "1101100010000101",   -- 1
    "1011000100001101",
    "0110001000011101",
    "1100010000111010",
    "1000100001110011",   -- poly-in
    "0001000011100001",
    "0010000111000010",
    "0100001110000100",
    "1000011100001000",
    "0000111000010111",
    "0001110000101110",
    "0011100001011100",
    "0111000010111000",
    "1110000101110000",
    "1100001011100111",
    "1000010111001001");   -- h
  constant u25r2_2_tbl : array_16x16 := (
    "0011110101000100",
    "0111101010001000",
    "1111010100010000",
    "1110101000100111",
    "1101010001001001",
    "1010100010010101",
    "0101000100101101",
    "1010001001011010",
    "0100010010110011",
    "1000100101100110",
    "0001001011001011",
    "0010010110010110",
    "0100101100101100",
    "1001011001011000",
    "0010110010110111",
    "0101100101101110");
  constant u26r2_2_tbl : array_16x16 := (
    "0001100101001101",
    "0011001010011010",
    "0110010100110100",
    "1100101001101000",
    "1001010011010111",
    "0010100110101001",
    "0101001101010010",
    "1010011010100100",
    "0100110101001111",
    "1001101010011110",
    "0011010100111011",
    "0110101001110110",
    "1101010011101100",
    "1010100111011111",
```

APPENDIX 1-continued

```
    "0101001110111001",
    "1010011101110010");
  signal r1        : std_logic_vector (15 downto 0);
  signal r2        : std_logic_vector (15 downto 0);
  signal r2_1      : std_logic_vector (15 downto 0);
  signal d1_1      : std_logic_vector (15 downto 0);
  signal d1r2_1    : std_logic_vector (15 downto 0);
  signal d9_1      : std_logic_vector (15 downto 0);
  signal u25r2_1   : std_logic_vector (15 downto 0);
  signal u26r2_1   : std_logic_vector (15 downto 0);
  signal r2_2      : std_logic_vector (15 downto 0);
  signal d1_2      : std_logic_vector (15 downto 0);
  signal d1r2_2    : std_logic_vector (15 downto 0);
  signal d9_2      : std_logic_vector (15 downto 0);
  signal u25r2_2   : std_logic_vector (15 downto 0);
  signal u26r2_2   : std_logic_vector (15 downto 0);
begin
-------------------------------------------------------------------
-- bit 0 of error is high bit
-- cd crc1 poly: x^16 + x^15 + x^2 + 1
-- cd crc2 poly: x^16 + x^2 + x + 1
-- ERR: DI + r
-- P:
-- STEP:      D1 (down 1 row)
-- NXT CW:    U26R2 (@ -1,x) (up 26 rows, right 2 cols)
-- NXT PASS:  U26R2 (@ 0,0)
-- if bypassing col, NXT CW: R2, NXT PASS: R2
-- Q:
-- STEP DN:   D1R2
-- STEP UP:   U25R2
-- NXT CW:
-- r<430:     U25R2,D9 (@ x,0)  (RIGHT_2_UP_16)
-- r>=430:    D1R2,D9 (@ x,0)   (RIGHT_2_DOWN_10)
-- NXT PASS:  U25R2,D9 (@ 0,0)
-- if bypassing diag, NXT CW: D1
--
-- R2:       alpha^(2*8=16)
-- D1:       alpha^(43*2*8=688)
-- D1R2:     alpha^(43*2*8+2*8=704)
-- D9:       alpha^(43*2*8*9=6192)
-- U25R2:    alpha^(2^15-1 - 43*2*8*25+2*8=15583)
-- U26R2:    alpha^(2^15-1 - 43*2*8*26+2*8=14895)
-- SEL: 0-NOP, 1-R2, 2-D1, 3-D1R2, 4-U25R2, 5-U26R2, 6-D9, 7-ERR
-------------------------------------------------------------------
    process (r1)
        variable sumr2     : std_logic_vector(15 downto 0);
        variable sumd1     : std_logic_vector(15 downto 0);
        variable sumd1r2   : std_logic_vector(15 downto 0);
        variable sumd9     : std_logic_vector(15 downto 0);
        variable sumu25r2  : std_logic_vector(15 downto 0);
        variable sumu26r2  : std_logic_vector(15 downto 0);
begin
    sumr2    := "0000000000000000";
    sumd1    := "0000000000000000";
    sumd1r2  := "0000000000000000";
    sumd9    := "0000000000000000";
    sumu25r2 := "0000000000000000";
    sumu26r2 := "0000000000000000";
    for i in 0 to 15 loop
        if (r1(i)='1') then
            sumr2    := sumr2 xor r2_1_tbl(i);
            sumd1    := sumd1 xor d1_1_tbl(i);
            sumd1r2  := sumd1r2 xor d1r2_1_tbl(i);
            sumd9    := sumd9 xor d9_1_tbl(i);
            sumu25r2 := sumu25r2 xor u25r2_1_tbl(i);
            sumu26r2 := sumu26r2 xor u26r2_1_tbl(i);
        end if;
    end loop;
    r2_1    <= sumr2;
    d1_1    <= sumd1;
    d1r2_1  <= sumd1r2;
    d9_1    <= sumd9;
    u25r2_1 <= sumu25r2;
    u26r2_1 <= sumu26r2;
end process;
process (r2)
    variable sumr2    : std_logic_vector(15 downto 0);
    variable sumd1    : std_logic_vector(15 downto 0);
    variable sumd1r2  : std_logic_vector(15 downto 0);
```

APPENDIX 1-continued

```
    variable sumd9      : std_logic_vector(15 downto 0);
    variable sumu25r2   : std_logic_vector(15 downto 0);
    variable sumu26r2   : std_logic_vector(15 downto 0);
begin
    sumr2    := "0000000000000000";
    sumd1    := "0000000000000000";
    sumd1r2  := "0000000000000000";
    sumd9    := "0000000000000000";
    sumu25r2 := "0000000000000000";
    sumu26r2 := "0000000000000000";
    for i in 0 to 15 loop
        if (r2(i)='1') then
            sumr2    := sumr2 xor r2_2_tbl(i);
            sumd1    := sumd1 xor d1_2_tbl(i);
            sumd1r2  := sumd1r2 xor d1r2_2_tbl(i);
            sumd9    := sumd9 xor d9_2_tbl(i);
            sumu25r2 := sumu25r2 xor u25r2_2_tbl(i);
            sumu26r2 := sumu26r2 xor u26r2_2_tbl(i);
        end if;
    end loop;
    r2_2    <= sumr2;
    d1_2    <= sumd1;
    d1r2_2  <= sumd1r2;
    d9_2    <= sumd9;
    u25r2_2 <= sumu25r2;
    u26r2_2 <= sumu26r2;
end process;
process
begin
    wait until (CLK'event) and (CLK='1');
    if (RST='1') then
        r1 <= "0000000000000000";
        r2 <= "0000000000000000";
            elsif (SEL="001") then
                r1 <= r2_1;
                r2 <= r2_2;
            elsif (SEL="010") then
                r1 <= d1_1;
                r2 <= d1_2;
            elsif (SEL="011") then
                r1 <= d1r2_1;
                r2 <= d1r2_2;
            elsif (SEL="100") then
                r1 <= u25r2_1;
                r2 <= u25r2_2;
            elsif (SEL="101") then
                r1 <= u26r2_1;
                r2 <= u26r2_2;
            elsif (SEL="110") then
                r1 <= d9_1;
                r2 <= d9_2;
            elsif (SEL="111") then
                r 1 <= r1 xor
                    DI0(0) & DI0(1) & DI0(2) & DI0(3) & DI0(4) & DI0(5) & DI0(6) & DI0(7) &
                    DI1(0) & DI1(1) & DI1(2) & DI1(3) & DI1(4) & DI1(5) & DI1(6) & DI1(7);
                r2 <= r2 xor
                    DI0(0) & DI0(1) & DI0(2) & DI0(3) & DI0(4) & DI0(5) & DI0(6) & DI0(7) &
                    DI1(0) & DI1(1) & DI1(2) & DI1(3) & DI1(4) & DI1(5) & DI1(6) & DI1(7);
        end if;
    end process;
    DO <= r2 & r1;
end BEHAVIORAL;
```

I claim:

1. An apparatus for processing a multi-dimensional code received from an optical storage device, wherein the multi-dimensional code comprises a first set of code words that intersect with a second set of code words, a read flag is associated with at least one code word, and an erasure pointer is associated with at least one symbol of one code word, the apparatus comprising:

(a) a buffer for storing the symbols of the code words; and (b) an error detection and correction (EDAC) system for detecting and correcting errors in the code words, wherein:

(i) the EDAC system checks the read flag of a first code word and, if the read flag is set, reads the first code word from the buffer;

(ii) the EDAC system clears at least one erasure pointer of the first code word if the first code word is error free; and (iii) the EDAC system sets the read flag of a second code word that intersects with the first code word at the cleared erasure pointer.

2. The apparatus as recited in claim 1, wherein the EDAC system sets at least one erasure pointer for the first code word if the first code word is uncorrectable.

3. The apparatus as recited in claim 2, wherein the EDAC system sets the read flag of a second code word that intersects with the first code word at the set erasure pointer.

4. The apparatus as recited in claim 1, wherein the EDAC system sets at least one erasure pointer for the first code word if the first code word is corrected but there is a high probability of a miscorrection.

5. The apparatus as recited in claim 4, wherein the EDAC system sets the read flag of a second code word that intersects with the first code word at the set erasure pointer.

6. The apparatus as recited in claim 1, wherein the erasure pointer has an initial setting.

7. The apparatus as recited in claim 1, wherein the EDAC system corrects a symbol of the first code word and sets the read flag of a second code word that intersects with the first code word at the corrected symbol.

8. The apparatus as recited in claim 6, wherein the EDAC system corrects a symbol of the first code word and sets the read flag of a second code word that intersects with the first code word at the corrected symbol.

9. The apparatus as recited in claim 1, wherein:
    (a) the erasure pointer does not have an initial setting; and
    (b) the EDAC system corrects a symbol of the first code word and sets all of the read flags of the code words that intersect with the first code word.

10. The apparatus as recited in claim 1, wherein:
    (a) the erasure pointer does not have an initial setting; and
    (b) the EDAC system corrects a symbol of the first code word and sets the read flag of the first code word.

11. The apparatus as recited in claim 1, wherein the EDAC system clears the read flag of the first code word.

12. A method for processing a multi-dimensional code received from an optical storage device, wherein the multi-dimensional code comprises a first set of code words that intersect with a second set of code words, a read flag is associated with at least one code word, and an erasure pointer is associated with at least one symbol of one code word, the method comprising the steps of:
    (a) storing the symbols of the code words in a buffer;
    (b) checking the read flag of a first code word and, if the read flag is set, reading the first code word from the buffer;
    (c) clearing at least one erasure pointer of the first code word if the first code word is error free; and
    (d) setting the read flag of a second code word that intersects with the first code word at the cleared erasure pointer.

13. The method as recited in claim 12, further comprising the step of setting at least one erasure pointer for the first code word if the first code word is uncorrectable.

14. The method as recited in claim 13, further comprising the step of setting the read flag of a second code word that intersects with the first code word at the set erasure pointer.

15. The method as recited in claim 12, further comprising the step of setting at least one erasure pointer for the first code word if the first code word is corrected but there is a high probability of a miscorrection.

16. The method as recited in claim 15, further comprising the step of setting the read flag of a second code word that intersects with the first code word at the set erasure pointer.

17. The method as recited in claim 12, wherein the erasure pointer has an initial setting.

18. The method as recited in claim 12, further comprising the steps of correcting a symbol of the first code word and setting the read flag of a second code word that intersects with the first code word at the corrected symbol.

19. The method as recited in claim 17, further comprising the steps of correcting a symbol of the first code word and setting the read flag of a second code word that intersects with the first code word at the corrected symbol.

20. The method as recited in claim 12, wherein the erasure pointer does not have an initial setting, further comprising the steps of correcting a symbol of the first code word and setting all of the read flags of the code words that intersect with the first code word.

21. The method as recited in claim 20, further comprising the step of setting all of the erasure pointers associated with the first code word.

22. The method as recited in claim 12, wherein the erasure pointer does not have an initial setting, further comprising the steps of correcting a symbol of the first code word and setting the read flag of the first code word.

23. The method as recited in claim 12, further comprising the step of clearing the read flag of the first code word.

24. A method for processing a multi-dimensional code received from an optical storage device, wherein the multi-dimensional code comprises a first set of code words that intersect with a second set of code words, a read flag is associated with at least one code word, and an erasure pointer is associated with at least one symbol of one code word, the method comprising the steps of:
    (a) storing the symbols of the code words in a buffer;
    (b) checking the read flag of a first set code word and, if the read flag is set, reading the first set code word from the buffer and clearing the read flag of the first set code word;
    (c) if the first set code word comprises a symbol in error:
        correcting the symbol in error; and
        setting the read flag of the second set code word that intersects with the first set code word at the corrected symbol;
        if the first set code word is error free:
        clearing at least one erasure pointer of the first set code word; and
        setting the read flag of the second set code word that intersects with the first set code word at the cleared erasure pointer;
    (d) repeating steps (b) and (c) until all of the read flags associated with the code words in the first set have been checked;
    (e) checking the read flag of a second set code word and, if the read flag is set, reading the second set code word from the buffer and clearing the read flag of the second set code word;
    (f) if the second set code word comprises a symbol in error:
        correcting the symbol in error; and
        setting the read flag of the first set code word that intersects with the second set code word at the corrected symbol;
        if the second set code word is error free:
        clearing at least one erasure pointer of the second set code word; and
        setting the read flag of the first set code word that intersects with the second set code word at the cleared erasure pointer;
    (g) repeating steps (e) and (f) until all of the read flags associated with the code words in the second set have been checked; and
    (h) iterating steps (b) through (g) until all of the code words are error free or until the number of iterations reaches a predetermined count.

* * * * *